(12) United States Patent
Hyun et al.

(10) Patent No.: US 10,312,138 B2
(45) Date of Patent: Jun. 4, 2019

(54) SEMICONDUCTOR DEVICES

(71) Applicants: Chung-Il Hyun, Hwaseong-si (KR); Semee Jang, Seoul (KR); Sung Yun Lee, Seongnam-si (KR)

(72) Inventors: Chung-Il Hyun, Hwaseong-si (KR); Semee Jang, Seoul (KR); Sung Yun Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/467,045

(22) Filed: Mar. 23, 2017

(65) Prior Publication Data
US 2018/0053686 A1      Feb. 22, 2018

(30) Foreign Application Priority Data

Aug. 16, 2016 (KR) .................. 10-2016-0103795

(51) Int. Cl.
| | |
|---|---|
| H01L 21/768 | (2006.01) |
| H01L 23/522 | (2006.01) |
| H01L 23/528 | (2006.01) |
| H01L 27/1157 | (2017.01) |
| H01L 27/11582 | (2017.01) |
| H01L 27/11575 | (2017.01) |

(52) U.S. Cl.
CPC .. *H01L 21/76816* (2013.01); *H01L 21/76877* (2013.01); *H01L 27/1157* (2013.01); *H01L 27/11575* (2013.01); *H01L 27/11582* (2013.01); *H01L 23/5226* (2013.01)

(58) Field of Classification Search
CPC ......... H01L 27/11556; H01L 27/11582; H01L 27/2481; H01L 23/528; H01L 23/5226; H01L 23/5286; H01L 21/76816; H01L 27/11548; H01L 27/11575
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,569,182 B2 | 10/2013 | Park et al. | |
| 8,654,587 B2 | 2/2014 | Yoon et al. | |

(Continued)

FOREIGN PATENT DOCUMENTS

KR      20110015338 A      2/2011

*Primary Examiner* — David C Spalla
(74) *Attorney, Agent, or Firm* — Harness, Dickey & Pierce, PLC

(57) ABSTRACT

A semiconductor device includes a comprise a substrate including a main zone and an extension zone, vertical channels on the main zone, and an electrode structure including gate electrodes stacked on the substrate. The vertical channel structures extend in a first direction perpendicular to a top surface of the substrate. The gate electrodes include line regions and contact regions. The line regions extend from the main zone toward the extension zone along a second direction the second direction that is perpendicular to the first direction. The contact regions are on ends of the line regions and are thicker than the line regions. A spacing distance in the second direction between the contact regions is greater than a spacing distance in the first direction between the line regions.

19 Claims, 27 Drawing Sheets

(56) References Cited

U.S. PATENT DOCUMENTS

| | | |
|---|---|---|
| 8,728,889 B2 | 5/2014 | Lee et al. |
| 9,171,859 B2 | 10/2015 | Oh et al. |
| 9,202,780 B2 | 12/2015 | Lee et al. |
| 2011/0233648 A1 | 9/2011 | Seol et al. |
| 2014/0197546 A1* | 7/2014 | Hwang ................. H01L 23/528 257/774 |
| 2015/0179564 A1 | 6/2015 | Lee et al. |
| 2015/0179577 A1 | 6/2015 | Tobitsuka et al. |
| 2015/0255385 A1 | 9/2015 | Lee et al. |
| 2015/0270165 A1 | 9/2015 | Hyun |
| 2015/0287710 A1* | 10/2015 | Yun .................... H01L 27/1157 257/314 |
| 2015/0303211 A1 | 10/2015 | Lee et al. |
| 2016/0056165 A1 | 2/2016 | Imamura |
| 2016/0056170 A1 | 2/2016 | Seong et al. |
| 2016/0064279 A1 | 3/2016 | Hyun |
| 2016/0079275 A1 | 3/2016 | Hyun et al. |
| 2016/0218107 A1* | 7/2016 | Lee ................... H01L 27/11548 |

* cited by examiner

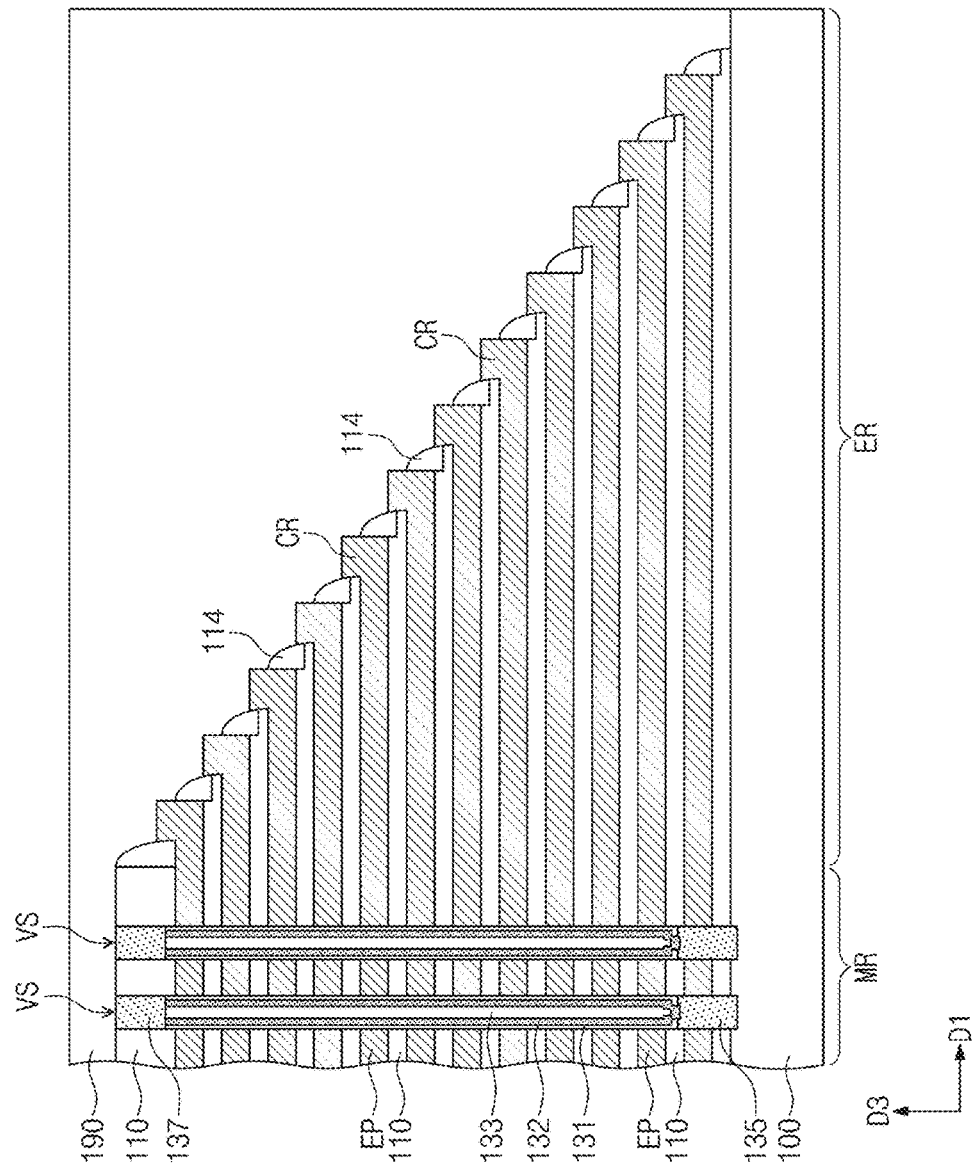

SEMICONDUCTOR DEVICES

CROSS-REFERENCE TO RELATED APPLICATIONS

This U.S. non-provisional patent application claims priority under 35 U.S.C § 119 to Korean Patent Application 10-2016-0103795, filed on Aug. 16, 2016, the entire contents of which are hereby incorporated by reference.

BACKGROUND

The present disclosure relates to a semiconductor device and, more particularly, to a three-dimensional semiconductor memory device.

It is desirable to increase an integration of semiconductor device for the purpose of satisfying high performance and low manufacturing cost. The integration of a semiconductor device may affect the prices of products. An integration of typical two-dimensional semiconductor device is primarily determined by the area occupied by a unit memory cell, so that it is greatly influenced by the level of technology for forming fine patterns. However, the expense of processing equipment used to increase pattern fineness sets a practical limitation on increasing the integration of two-dimensional semiconductor device.

SUMMARY

Inventive concepts relate to a semiconductor device that can be manufactured by a simple process and has increased integration and reliability.

According to some example embodiments of inventive concepts, a semiconductor device may include a substrate including a main zone and an extension zone; vertical channel structures on the main zone and extending in a first direction perpendicular to a top surface of the substrate; and an electrode structure including gate electrodes stacked on the substrate. The vertical channel structure may extend in a first direction perpendicular to a top surface of the substrate. The gate electrodes may include line regions and contact regions. The line regions may extend from the main zone toward the extension zone along a second direction that is perpendicular to the first direction. The contact regions may be on ends of the line regions and may be thicker than the line regions. A spacing distance in the second direction between the contact regions may be greater than a spacing distance in the first direction between the line regions.

According to some example embodiments of inventive concepts, a semiconductor device may include a substrate including a main zone and an extension zone; an electrode structure including gate electrodes stacked on the substrate; and vertical channel structures on the main zone and penetrating the electrode structure. Each of the gate electrodes may include a line region and a contact region. The line region may extend from the main zone toward the extension zone. The contact region may be on an end of the line region and thicker than the line region. A top surface of the contact region may be higher than a bottom surface of the line region of the gate electrode directly above the contact region.

According to some example embodiments of inventive concepts, a semiconductor device may include a memory cell array on a substrate. The memory cell array may include gate electrodes stacked on top of each other. Each of gate electrodes may include a line region and a contact region connected to an end of the line region. The gate electrodes may include a first gate electrode over a second gate electrode. The line regions of the first and second gate electrodes may be separated from each other by a first distance in a first direction vertical to a top surface of the substrate. The contact regions of the first and second gate electrodes may be separated from each other by a second distance in a second direction that is parallel to the top surface of the substrate and greater than the first distance. A top surface of the contact region of the first gate electrode may be above a top surface of the line region of the first gate electrode. A top surface of the contact region of the second gate electrode may be above a top surface of the region of the second gate electrode.

BRIEF DESCRIPTION OF THE DRAWINGS

FIG. 6 is a cross-sectional view of a semiconductor device according to some example embodiments of inventive concepts.

DETAILED DESCRIPTION

Hereinafter, it will be described in detail about some example embodiments of inventive concepts with reference to accompanying drawings.

Figure 1:
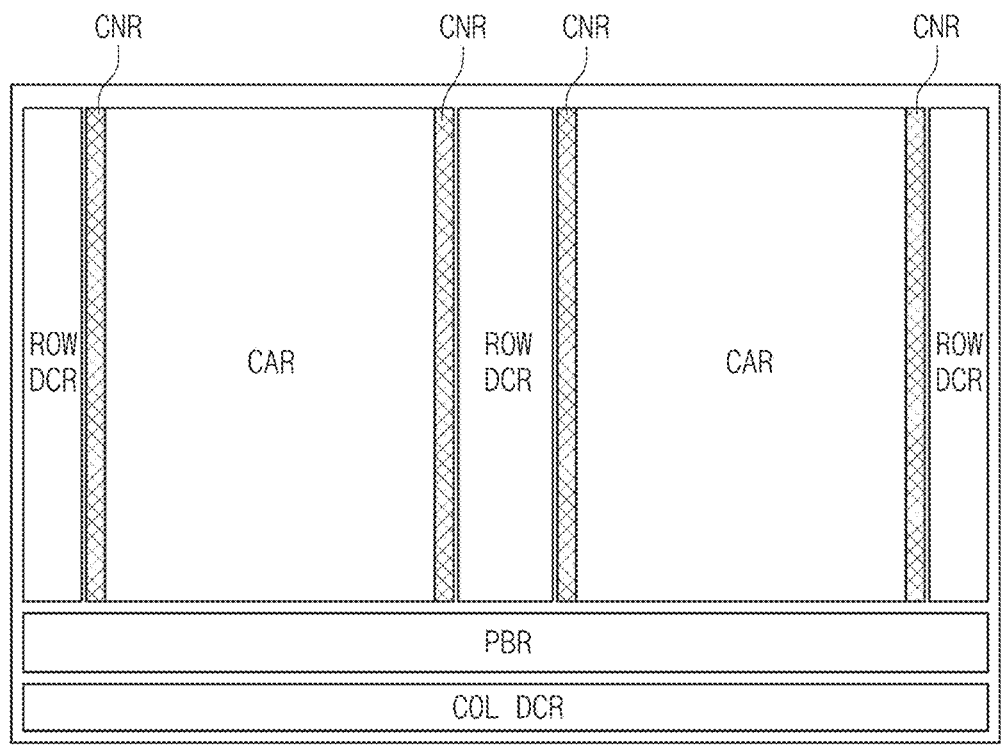
FIG. 1 is a schematic diagram for explaining a rough configuration of a semiconductor device according to some example embodiments of inventive concepts.

FIG. 1 is a schematic diagram for explaining a rough configuration of a semiconductor device according to some example embodiments of inventive concepts.

Referring to FIG. 1, a semiconductor device may include a cell array region CAR and a peripheral circuit region. The peripheral circuit region may include row decoder regions ROW DCRs, a page buffer region PBR, a column decoder region COL DCR, and a control circuit region (not shown). In some example embodiments, a connection region CNR may be disposed between the cell array region CAR and the row decoder region ROW DCR.

The cell array region CAR may be provided with a memory cell array including a plurality of memory cells. In some example embodiments, the memory cell array may be a three-dimensional (3D) memory array that includes three-dimensionally arranged memory cells, a plurality of word lines electrically connected to the memory cells, and a plurality of bit lines electrically connected to the memory cells. The 3D memory array may be monolithically formed on a substrate (e.g., semiconductor substrate such as silicon, or semiconductor-on-insulator substrate). The 3D memory array may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The row decoder region ROW DCR may be provided with a row decoder that selects the word lines of the memory cell array, and the connection region CNR may be provided with an interconnect line structure including contact plugs and interconnect lines that electrically connect the memory cell array and the row decoder to each other. The row decoder may select one of the word lines of the memory cell array in accordance with address information. The row decoder may provide word line voltages to the selected word line and unselected word lines in response to control signals from a control circuit.

The page buffer region PBR may be provided with a page buffer that reads data stored in the memory cells. Depending on an operating mode, the page buffer may temporarily store data to be stored in the memory cells or sense data stored in the memory cells. The page buffer may function as a write driver in a program operating mode and as a sense amplifier in a read operating mode.

The column decoder region COL DCR may be provided with a column decoder connected to the bit lines of the memory cell array. The column decoder may provide a data transmission path between the page buffer and an external device (e.g., a memory controller).

Figure 2:
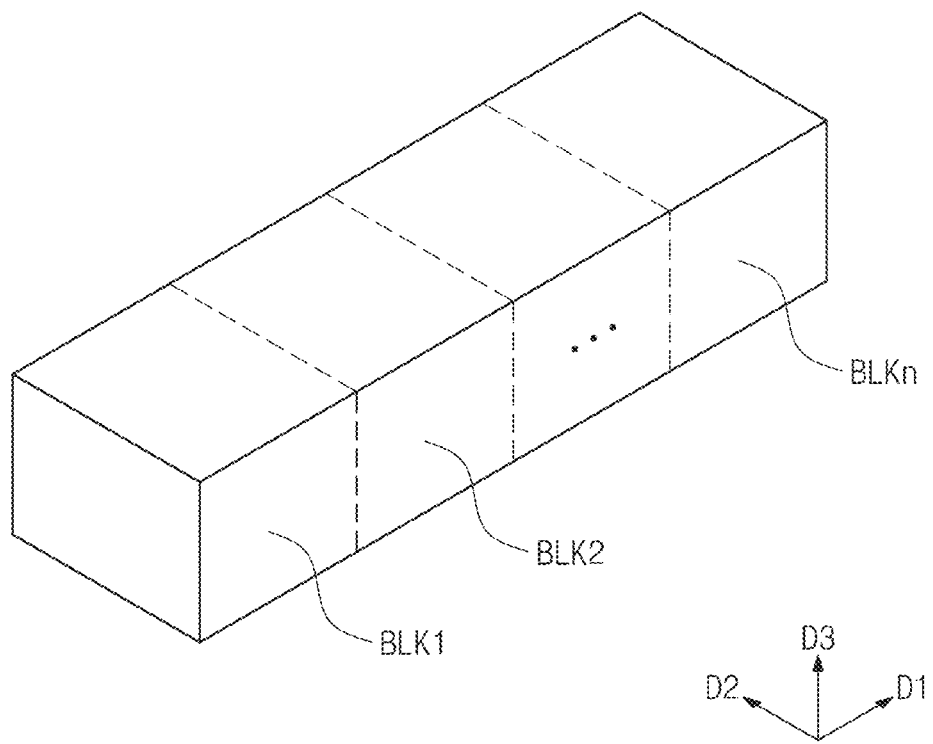
FIG. 2 is a block diagram roughly illustrating a cell array of a semiconductor device according to some example embodiments of inventive concepts.

FIG. 2 is a block diagram roughly illustrating a cell array of a semiconductor device according to some example embodiments of inventive concepts.

Referring to FIG. 2, the cell array region CAR may include a plurality of cell array blocks BLK1, BLK2, ..., and BLKn. Each of the cell array blocks BLK1, BLK2, ..., and BLKn may include an electrode structure having electrodes stacked along a third direction D3 on a plane extending along first and second directions D1 and D2 crossing each other. The electrode structure may combine with a plurality of vertical channel structures (or semiconductor pillars) to constitute three-dimensionally arranged memory cells. Each of the cell array blocks BLK1, BLK2, ..., and BLKn may include bit lines electrically connected to the memory cells.

Figure 3:
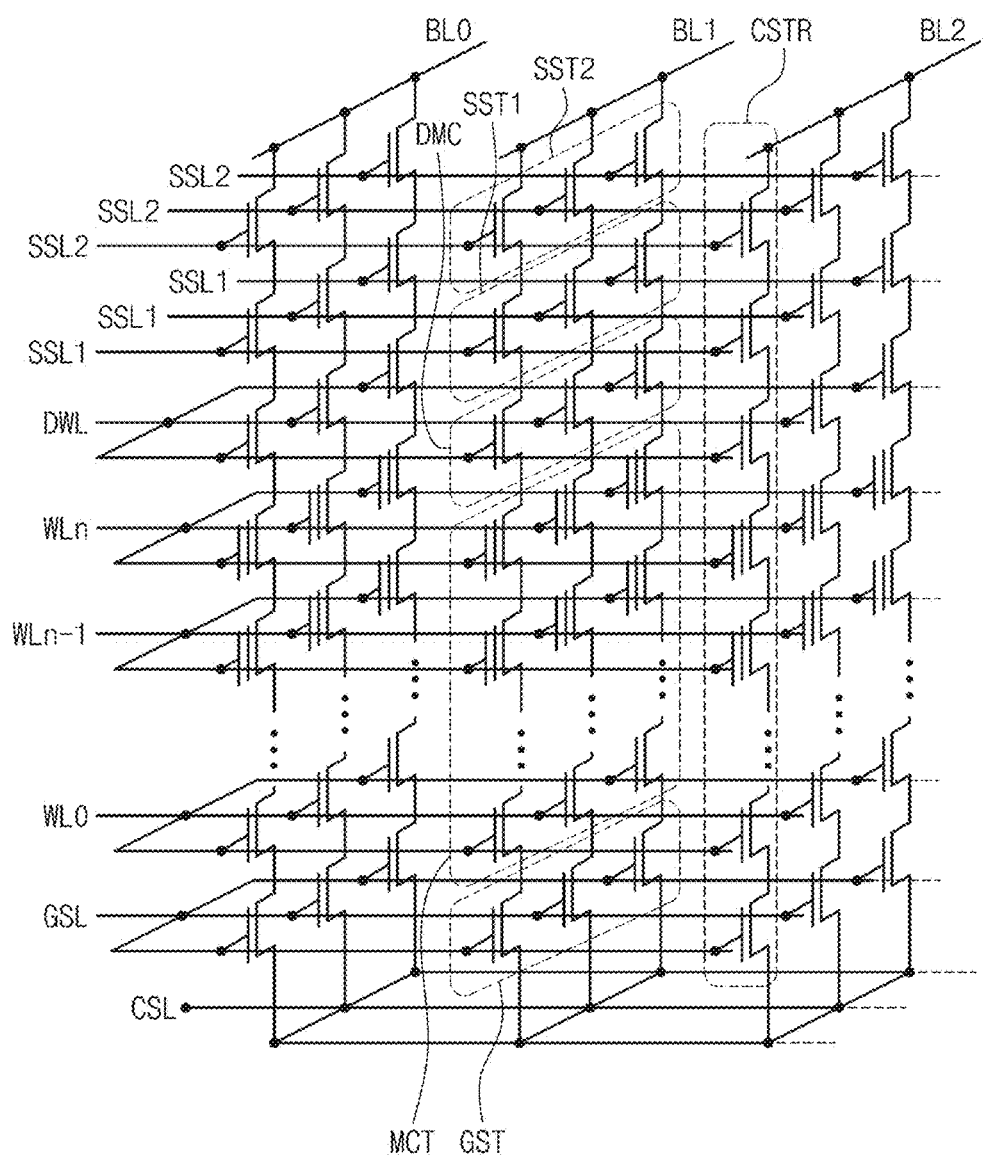
FIG. 3 is a circuit diagram of a semiconductor device according to some example embodiments of inventive concepts.

FIG. 3 is a circuit diagram of a semiconductor device according to some example embodiments of inventive concepts.

Referring to FIG. 3, a cell array of a semiconductor device according to some example embodiments may include a common source line CSL, a plurality of bit lines BL0 to BL2, and a plurality of cell strings CSTRs disposed between the common source line CSL and the bit lines BL0 to BL2.

The bit lines BL0 to BL2 may be two-dimensionally arranged, and a plurality of cell strings CSTRs may be connected in parallel to each of the bit lines BL0 to BL2. A plurality of cell strings CSTRs may be connected in common to the common source line CSL. For example, a plurality of cell strings CSTRs may be disposed between a plurality of bit lines BL0 to BL2 and a single common source line CSL. The common source line CSL may be provided in plural, which may be two-dimensionally arranged. For example, the common source lines CSLs may be supplied with the same voltage or electrically controlled independently from each other.

In some example embodiments, each of the cell strings CSTRs may include string select transistors SST1 and SST2 connected in series, memory cells MCT connected in series, and a ground select transistor GST. Each of the memory cells MCT may include a data storage element.

For example, each of the cell strings CSTRs may include first and second string select transistors SST and SST2 connected in series, the second string select transistor SST2 may be coupled to one of the bit lines BL0 to BL2, and the ground select transistor GST may be coupled to the common source line CSL. The memory cells MCT may be connected in series between the first string select transistor SST1 and the ground select transistor GST.

Each of the cell strings CSTRs may further include a dummy cell DMC connected between the first string select transistor SST1 and the memory cell MCT. As not shown in figures, the dummy cell DMC may also be connected between the ground select transistor GST and the memory cell MCT.

Alternatively, for each of the cell strings CSTRs, the ground select transistor GST may include a plurality of MOS transistors connected in series similar to the first and second string select transistors SST1 and SST2. Alternatively, each of the cell strings CSTRs may include a single string select transistor.

In some example embodiments, the first string select transistor SST1 may be controlled by a first string select line SSL1, and the second string select transistor SST2 may be controlled by a second string select line SSL2. The memory cells MCT may be controlled by a plurality of word lines WL0 to WLn, and the dummy cells DMC may be controlled by a dummy word line DWL. The ground select transistor GST may be controlled by a ground select line GSL. The common source line CSL may be connected in common to sources of the ground select transistors GST.

A single cell string CSTR may include a plurality of memory cells MCT that are spaced apart from the common source line CSL at different distances. A plurality of word lines WL0 to WLn and DWL may be disposed between the common source lines CSL and the bit lines BL0 to BL2.

The memory cells MCT may include gate electrodes, which are spaced apart from the common source lines CSL at substantially the same distance, connected in common to one of the word lines WL0 to WLn and DWL to have an equipotential state. In contrast, although the gate electrodes of the memory cells MCT are spaced apart from the common source lines CSL at substantially the same distance, the gate electrodes disposed at different rows or columns may be independently controlled.

Figure 4:
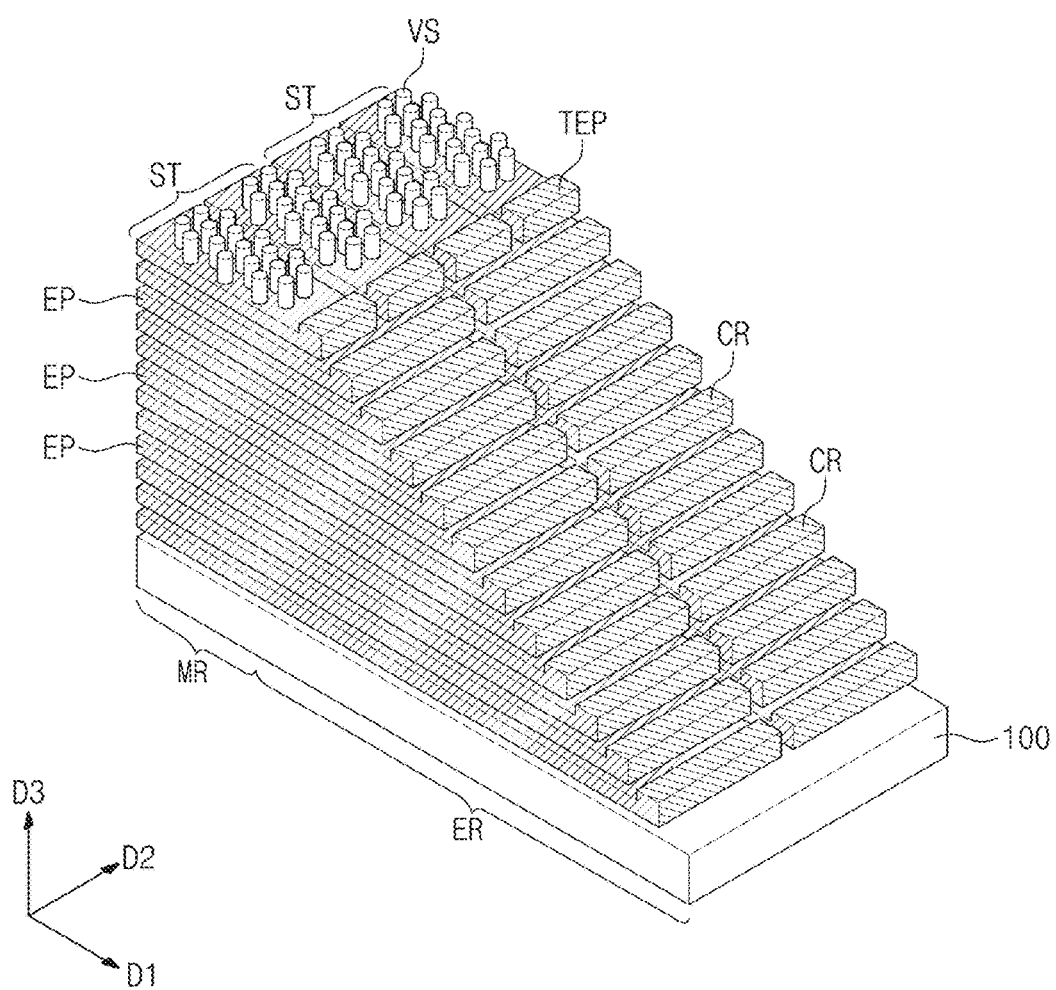
FIG. 4 is a perspective view of a semiconductor device according to some example embodiments of inventive concepts.

FIG. 4 is a perspective view of a semiconductor device according to some example embodiments of inventive concepts. FIGS. 5A to 5F are cross-sectional views of a semiconductor device according to some example embodiments of inventive concepts.

Figure 5A:
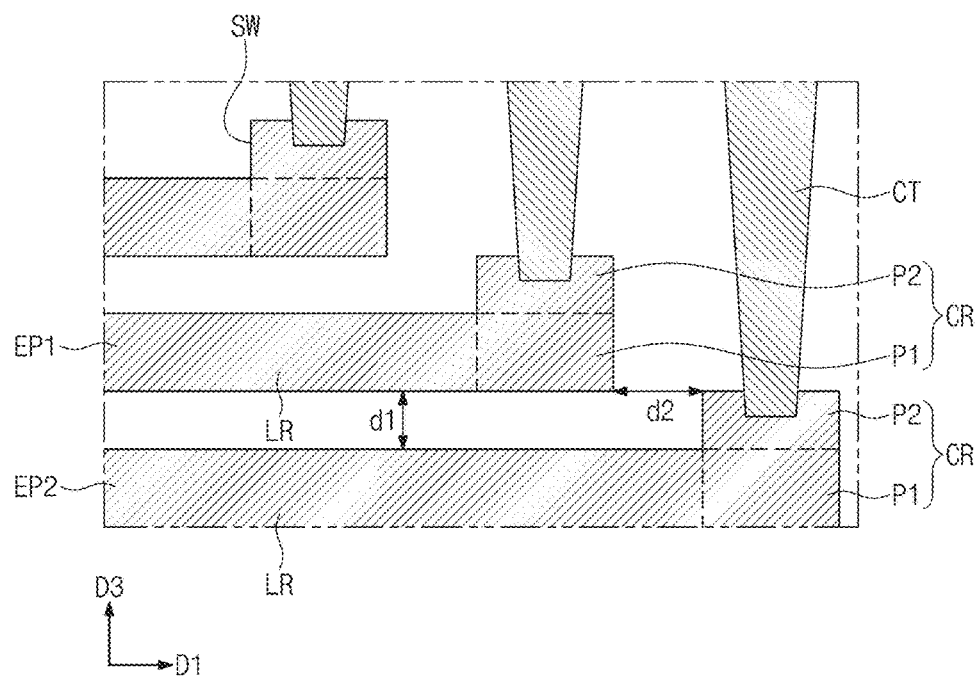
FIGS. 5A to 5F are cross-sectional views of a semiconductor device according to some example embodiments of inventive concepts.

Referring to FIGS. 4 and 5A, electrode structures ST may be provided on a substrate 100. The substrate 100 may be a semiconductor substrate having a first conductivity, for example, a p-type conductivity. The semiconductor substrate may be one of a single crystalline silicon layer, an SOI (silicon on insulator) substrate, a silicon layer formed on a silicon-germanium (SiGe) layer, a single crystalline silicon layer formed on an insulation layer, and a polysilicon layer formed on an insulation layer.

The electrode structures ST may be spaced apart from each other in a second direction D2 perpendicular to first and third directions D1 and D3. Although two electrode structures ST are illustrated for brevity of the description, inventive concepts are not limited thereto.

The substrate 100 may include a main zone MR, which is provided with memory cells, and an extension zone ER, which is provided for connection between gate electrodes EP and interconnect lines. Vertical channel structures VS may be provided on the main zone MR. The vertical channel structures VS may include channel regions, penetrate the electrode structures ST, and constitute the memory cells. For example, the vertical channel structures VS may be arranged in a zigzag fashion along the first direction D1 parallel to a top surface of the substrate 100. The vertical channel structures VS will be further discussed below in more detail with reference to FIG. 6.

The gate electrodes EP may be sequentially stacked on the substrate 100 along the third direction D3 perpendicular to the top surface of the substrate 100. Insulation layers (not shown) may be provided between the gate electrodes EP, but the insulation layers are omitted to illustrate for simplicity of the description. Each of the gate electrodes EP may extend in the first direction D1 and have, on the extension zone ER, a stepwise structure for connecting with the interconnect lines. For example, each of the gate electrodes EP may have a length in the first direction D1 less than a length of a next underlying gate electrode EP, and thus each of gate electrodes EP may expose a contact region CR connected to a contact that is discussed below.

For each electrode structure ST, an uppermost story TEP of the gate electrodes EP may include a plurality of patterns that are separated in the second direction D2. For example, the uppermost story TEP may correspond to the string select lines discussed with reference to FIG. 3. Besides the uppermost story TEP, underlying gate electrodes directly below the uppermost story TEP may also correspond to the string select lines, and in this case a relevant layer consisting of the underlying gate electrodes may include a plurality of patterns separated in the second direction D2 as like the uppermost story TEP.

As shown in FIGS. 5A to 5F, each of the gate electrodes EP may include a line region LR, which extends from the main zone MR toward the extension zone ER, and a contact region CR, which is provided on an end of the line region LR and whose thickness is greater than that of the line region LR. The contact regions CR may be portions that are coupled to contacts CT through which interconnect lines are connected thereto. For example, a lower portion of the contact CT may be inserted under a top surface of the contact region CR.

The contact region CR may include a lower portion P1 connected to the line region LR and an upper portion P2 on the lower portion P1. The lower portion P1 may be a portion whose thickness in the third direction D3 is substantially the same as that of the line region LR, and the upper portion P2 may be a portion protruding from a top surface of the line region LR. For example, the thickness of the contact region CR may be about 1.1 to 2.0 times the thickness of the line region LR. As the thickness of the contract region CR is relatively greater than the thickness of the line region LR, the contact regions CR may be limited (and/or prevented) from being penetrated when forming contact holes in which the contacts CT are provided.

Neighboring contact regions CR may be spaced apart from each other at a desired (and/or alternatively predetermined) distance. For example, the contact regions CR may be spaced apart from each other in the first direction D1 at a spacing distance d2 greater than a spacing distance d1 in the third direction D3 between the line regions LR spaced apart from each other. For example, when the electrode structure ST includes first and second gate electrodes EP1 and EP1 that are adjacent to each other in the third direction D3, the spacing distance d2 between the contact regions CR of the first and second gate electrodes EP1 and EP2 may be greater than the spacing distance d1 between a bottom surface of the line region LR included in the first gate electrode EP1 and a top surface of the line region LR included in the second gate electrode EP2. The spacing distances between the contact regions CR may limit and/or prevent a bridge phenomenon caused by connection between neighboring gate electrodes EP when the gate electrodes EP are formed.

Figure 5B:
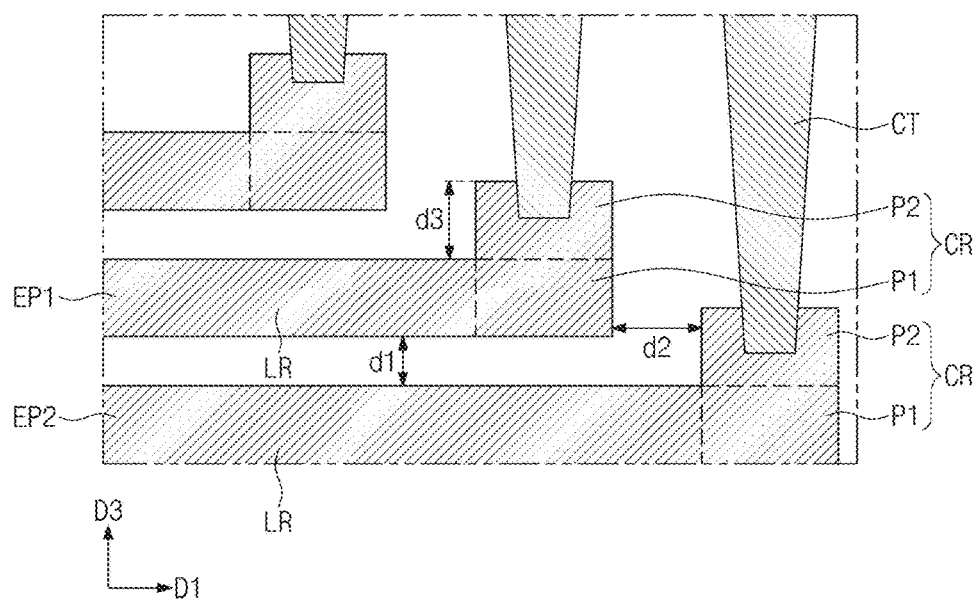

In some example embodiments, as shown in FIG. 5A, an underlying contact region CR may have a top surface equal to or lower than a bottom surface of an overlying contract region CR directly above the underlying contact region CR. In other example embodiments, as shown in FIG. 5B, an underlying contact region CR may have a top surface higher than a bottom surface of an overlying contract region CR directly above the underlying contact region CR. For example, the upper portion P2 of the second gate electrode EP2 may have a thickness d3 greater than the spacing distance d1 between the line regions LR of the first and second gate electrodes EP1 and EP2.

Figure 5C:
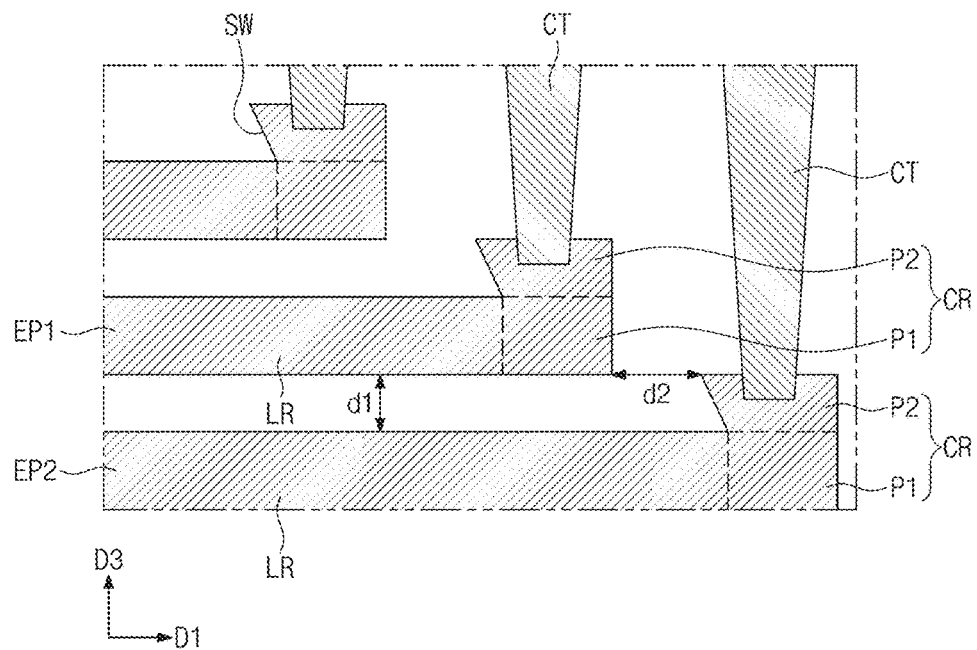

In some example embodiments, as shown in FIG. 5A, the upper portion P2 may have a sidewall SW substantially perpendicular to the top surface of the substrate 100. In other example embodiments, as shown in FIG. 5C, the sidewall SW of the upper portion P2 may make an acute angle with the top surface of the line region LR.

Figure 5D:
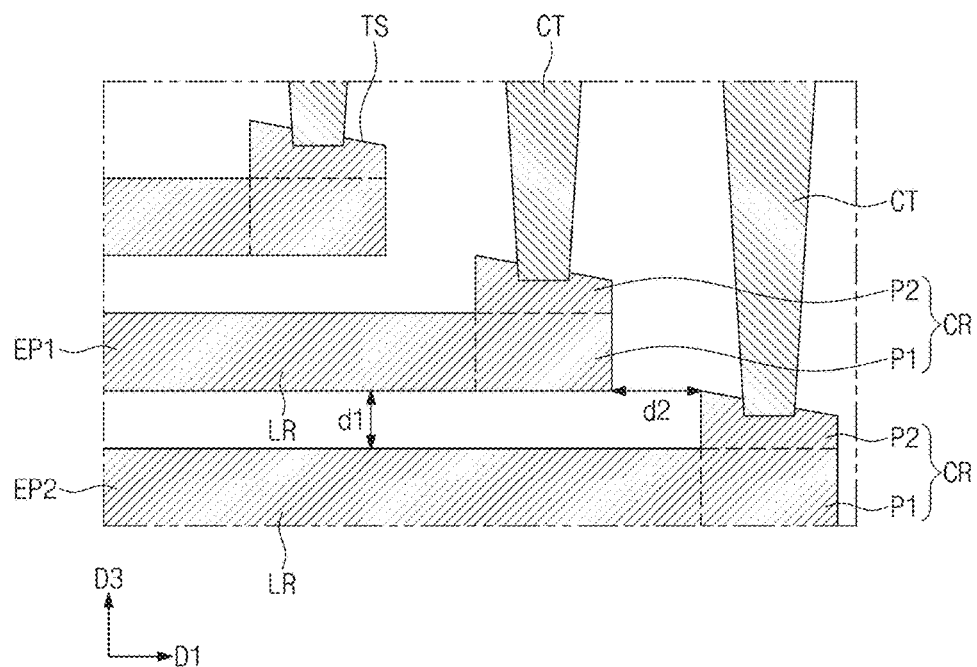

In some example embodiments, as shown in FIG. 5A, the contact regions CR may have substantially the same thickness. In other example embodiments, as shown in FIG. 5D, the thickness of the contact region CR may decrease with increasing distance from the line region LR.

Figure 5E:
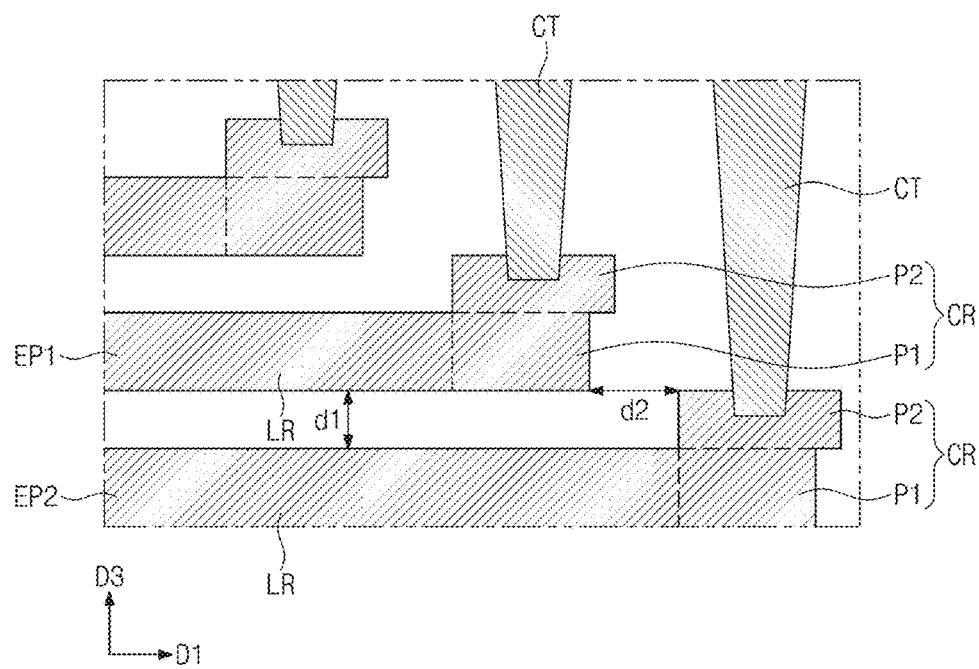

In some example embodiments, as shown in FIG. 5A, the lower portion P1 may have a sidewall aligned with an opposite sidewall of the upper portion P2. In other example embodiments, as shown in FIG. 5E, the upper portion P2 may have a sidewall that protrudes in the first direction D1 from a sidewall of the lower portion P1.

Figure 5F:
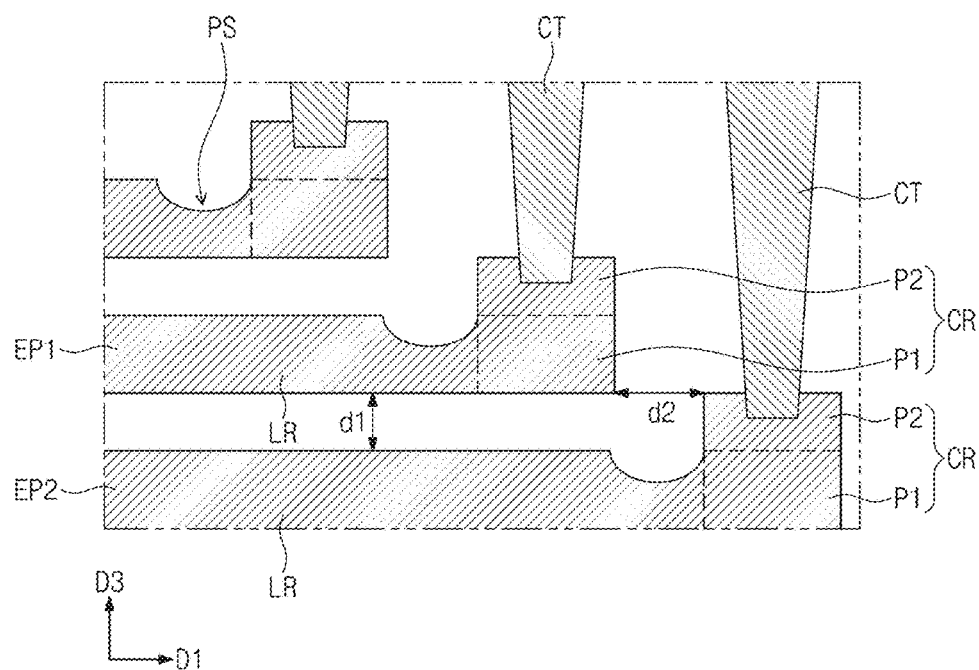

In some example embodiments, as shown in FIG. 5A, the contact region CR may have a flat top surface. In other example embodiments, as shown in FIG. 5F, the line region LR may have a recession PS, which is adjacent to the contact region CR and whose top surface is recessed.

FIG. 6 is a cross-sectional view of a semiconductor device according to some example embodiments of inventive concepts. A substrate 100 may be provided thereon with an electrode structure, and the electrode structure may include gate electrodes EP sequentially stacked. The gate electrodes EP may include one or two layers, which are most adjacent to the substrate 100, corresponding to the ground select line GSL discussed with reference to FIG. 3. The gate electrodes EP may include other one or two layers, which are most far away from the substrate 100, corresponding to the string select lines SSL1 and SSL2 discussed with reference to FIG. 3. The remaining gate electrodes EP may correspond to the word lines WL0 to WL2 and DWL discussed with reference to FIG. 3. The gate electrodes EP may include doped silicon, metal (e.g., tungsten), metal nitride, metal silicide, or any combination thereof. Although figures show that twelve gate electrodes are vertically stacked, the number of the gate electrodes may be more or less than that shown in figures.

A buffer insulation layer may be provided between the substrate 100 and a lowermost one of the gate electrodes EP. The buffer insulation layer may be a silicon oxide layer. Insulation patterns 110 may be provided between the gate electrodes EP that are vertically stacked. The insulation patterns 110 may include a silicon oxide layer or a silicon oxynitride layer. The insulation patterns 110 may have the same thickness, but not limited thereto. For example, an uppermost one of the insulation patterns 110 may have a thickness greater than those of its underlying insulation patterns 110.

The substrate 100 may include a main zone MR, which is provided with memory cells, and an extension zone ER, which is provided for connection between gate electrodes EP and interconnect lines. Vertical channel structures VS may be provided on the main zone MR. The vertical channel structures VS may penetrate the gate electrodes EP. Each of the vertical channel structures VS may include a lower semiconductor pattern 135 and an upper semiconductor pattern 132 on the lower semiconductor pattern 135. The lower and upper semiconductor patterns 135 and 132 may be regions where a channel of transistors is formed. The lower and upper semiconductor patterns 135 and 132 may include silicon, germanium, or a mixture thereof. The lower and upper semiconductor patterns 135 and 132 may have crystal structures different from each other. For example, the lower and upper semiconductor patterns 135 and 132 may include at least one selected from a single crystalline structure, an amorphous structure, and a polycrystalline structure. The lower and upper semiconductor patterns 135 and 132 may be undoped or doped with impurities having the same conductivity as the substrate 100.

A data storage layer 131 may be provided between the upper semiconductor pattern 132 and the gate electrodes EP. The data storage layer 131 may include a tunnel insulation layer, a charge storage layer, and a blocking insulation layer that are sequentially stacked on the upper semiconductor pattern 132. Although not shown in figures, a gate dielectric layer may be provided between the lower semiconductor pattern 135 and the lowermost gate electrode EP. For example, the gate dielectric layer may include silicon oxide.

The blocking insulation layer may be a multiple layer composed of (or including) a plurality of thin layers. For example, the blocking insulation layer may include a hafnium oxide layer, an aluminum oxide layer, and/or a silicon oxide layer, and the stacking order thereof may be variously changed. The charge storage layer may be an insulation layer including a charge trap layer or conductive nanoparticles. The charge trap layer may include, for example, a silicon nitride layer. The tunnel insulation layer may include a silicon oxide layer. The tunnel insulation layer may further include a high-k dielectric layer (e.g., a hafnium oxide layer or an aluminum oxide layer). In certain embodiments, the data storage layers 131 may be a variable resistance pattern. The variable resistance pattern may include at least one of materials having variable resistance characteristics that can change its resistance.

Each of the vertical channel structures VS may include a buried insulation pattern 133 surrounded by the upper semiconductor pattern 132. The buried insulation pattern 133 may include silicon oxide or silicon oxynitride. Alternatively, the buried insulation pattern 133 may be omitted.

Conductive patterns 137 may be provided in upper portions of the vertical channel structures VS. The conductive patterns 137 may include a doped semiconductor material or a metal material. For example, the conductive patterns 137 may include the same material as the upper semiconductor pattern 132. For example, the conductive patterns 137 may include doped polysilicon. An interlayer dielectric layer 190 may be provided to cover the electrode structure. The interlayer dielectric layer 190 may include a silicon oxide layer.

The gate electrodes EP may include contact regions CR discussed with reference to FIGS. 4 and 5A to 5F. In some example embodiments, spacers 114 may be provided on sidewalls of the contact regions CR. For example, the spacers 114 may be provided on the insulation patterns 110. In other words, each of the insulation patterns 110 may protrude in a first direction D1 more than its overlying gate electrode EP that is in contact with and provided on the each of the insulation patterns 110, and the spacers 114 may be provided on protruding top surfaces of the insulation patterns 110. Differently from that shown in figures, the insulation patterns 110 may not protrude in the first direction D1 from the gate electrodes EP, and the spacers 114 may be in contact with top surfaces of the gate electrodes EP directly under the spacers 114. Each of the spacers 114 may be in contact with sidewalls of a pair of its adjacent contact regions CR. The spacers 114 may include the same material as the insulation patterns 110. For example, the spacers 114 may include silicon oxide. The spacers 114 may serve to secure a spacing distance between the contact regions CR adjacent to each other.

FIGS. 7 to 12 are cross-sectional views for explaining a method of manufacturing a semiconductor device according to some example embodiments of inventive concepts.

Figure 7:
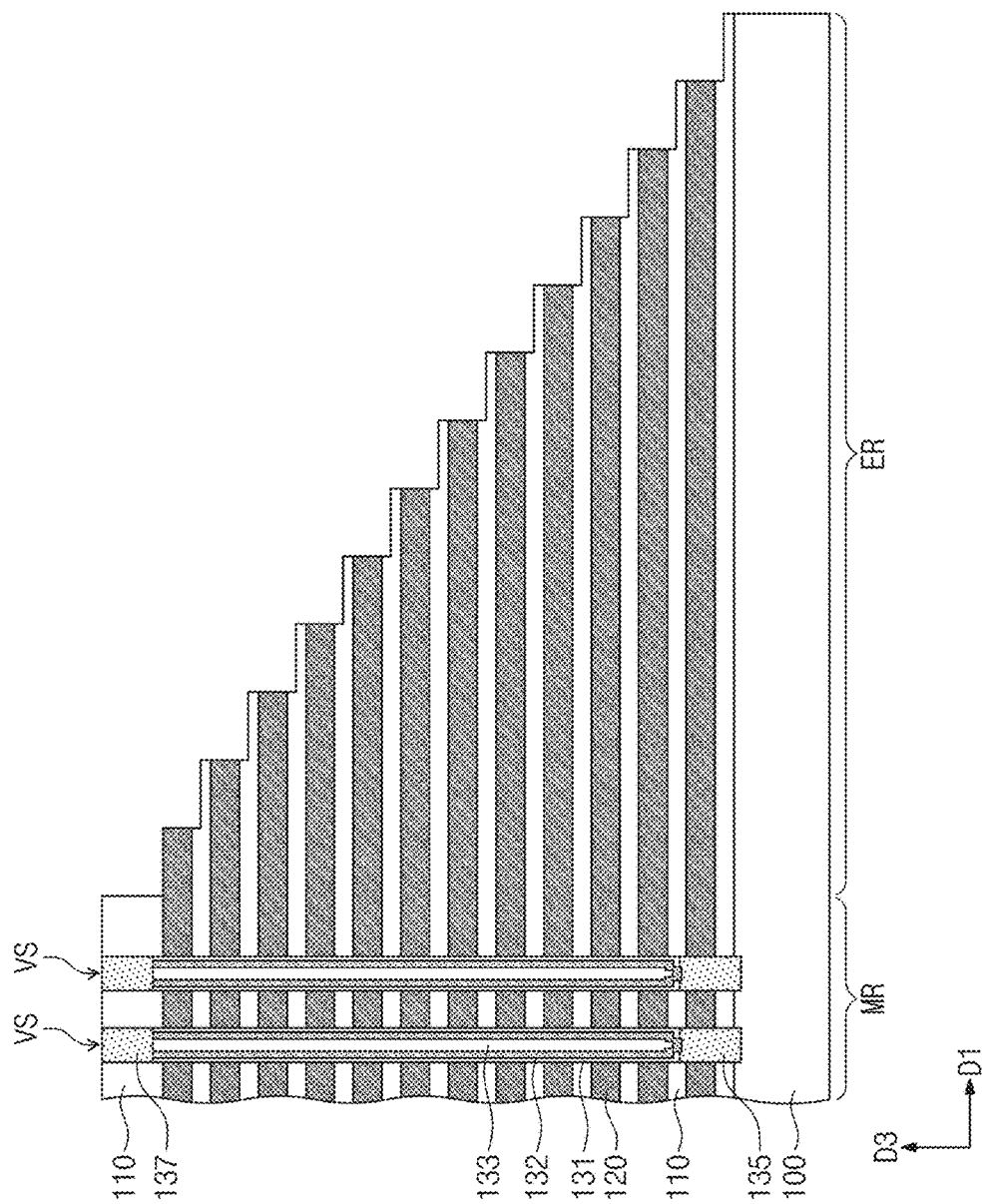
FIGS. 7 to 12 are cross-sectional views for explaining a method of manufacturing a semiconductor device according to some example embodiments of inventive concepts.

Referring to FIG. 7, a buffer insulation layer may be formed on a substrate 100 and then insulation patterns 110 and sacrificial patterns 120 may be alternately and repeatedly formed. For example, the buffer insulation layer may be formed by a thermal oxidation process. The sacrificial patterns 120 may include a material having a different etch selectivity with respect to the insulation patterns 110. For example, the sacrificial patterns 120 may include a silicon nitride layer, a silicon oxynitride layer, a polysilicon layer, or a polysilicon germanium layer. The sacrificial patterns 120 and the insulation patterns 110 may be formed by, for example, a chemical vapor deposition (CVD).

Vertical channel structures VS may be formed to penetrate the sacrificial patterns 120 and the insulation patterns 110. The sacrificial patterns 120 and the insulation patterns 110 may be penetrated by vertical holes that are formed on a main zone MR of the substrate 100, and then the vertical channel structures VS may be formed in the channel holes. Lower semiconductor patterns 135 may be formed in lower portions of the vertical holes by performing an epitaxial process that uses a top surface of the substrate 100 as a seed. Substantially single crystalline silicon may grow to form the lower semiconductor patterns 135. In other example embodiments, the formation of the lower semiconductor patterns 135 may be skipped.

A data storage layer 131 may be formed in the vertical holes including the lower semiconductor pattern 135 therein. The data storage layer 131 may include a blocking insulation layer, a charge storage layer, and a tunnel insulation layer that are sequentially formed on sidewalls of the vertical holes. In other example embodiments, it may be possible to omit the formation, in the current process step, of at least one of the blocking insulation layer, the charge storage layer, and the tunnel insulation layer that constitute the data storage layer 131, and the omitted formation may be performed after processes discussed below with reference to FIG. 12.

Upper semiconductor patterns 132 may be formed to penetrate the data storage layer 131 such that the lower and upper semiconductor patterns 135 and 132 may be connected to each other. For example, the formation of the upper semiconductor patterns 132 may include a spacer process for penetrating a lower portion of the data storage layer 131 and a formation process for forming a plurality of semiconductor layers.

Buried insulation patterns 133 may be formed to fill the vertical holes in which the upper semiconductor patterns 132 are provided. The upper semiconductor patterns 132 and the buried insulation patterns 133 may be partially removed to form recess regions at their upper portions and then conductive patterns 137 may be formed in the recessed regions.

The sacrificial patterns 120 and the insulation patterns 110 may be partially etched to form a stepwise structure on an extension zone ER of the substrate 100. For example, the formation of the stepwise structure may include forming a mask pattern (not shown) and sequentially etching the sacrificial patterns 120 and the insulation patterns 110 while gradually decreasing a width of the mask pattern. Each of the insulation patterns 110 may be formed to have a portion remaining on its underlying sacrificial pattern 120 as shown in figures, or alternatively each of the insulation patterns 110 may be formed aligned with a sidewall of its overlying sacrificial pattern 120.

Figure 8:
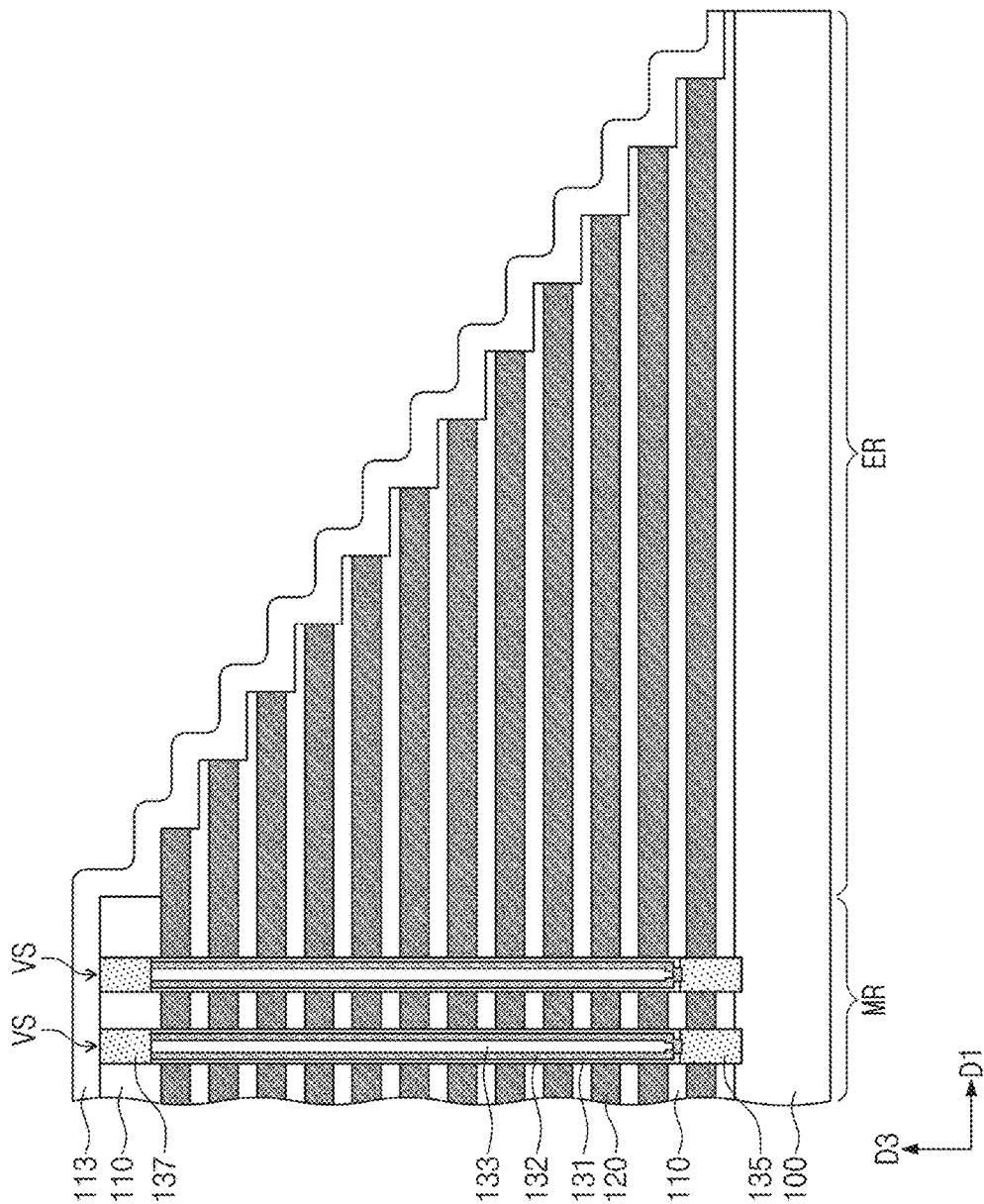
Figure 9:
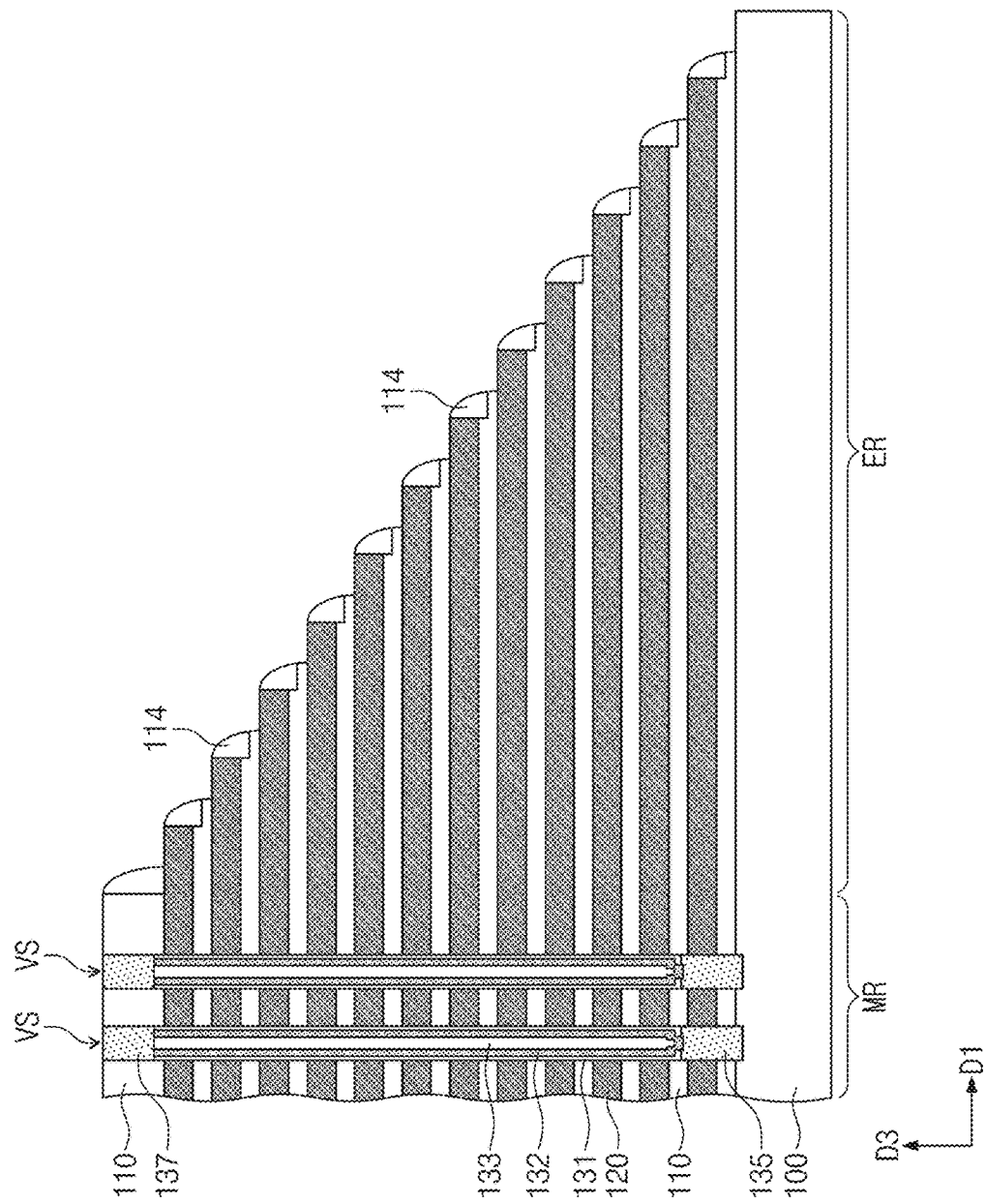

Referring to FIGS. 8 and 9, a first insulation layer 113 may be formed to cover the stepwise structure and then an etch-back process may be performed to form spacers 114. For example, the first insulation layer 113 may be formed of a material that exhibits a high etch selectivity relative to the sacrificial patterns 120 but a low etch selectivity relative to the insulation patterns 110. For example, the first insulation layer 113 may be formed of the same material as the insulation patterns 110.

Figure 10:
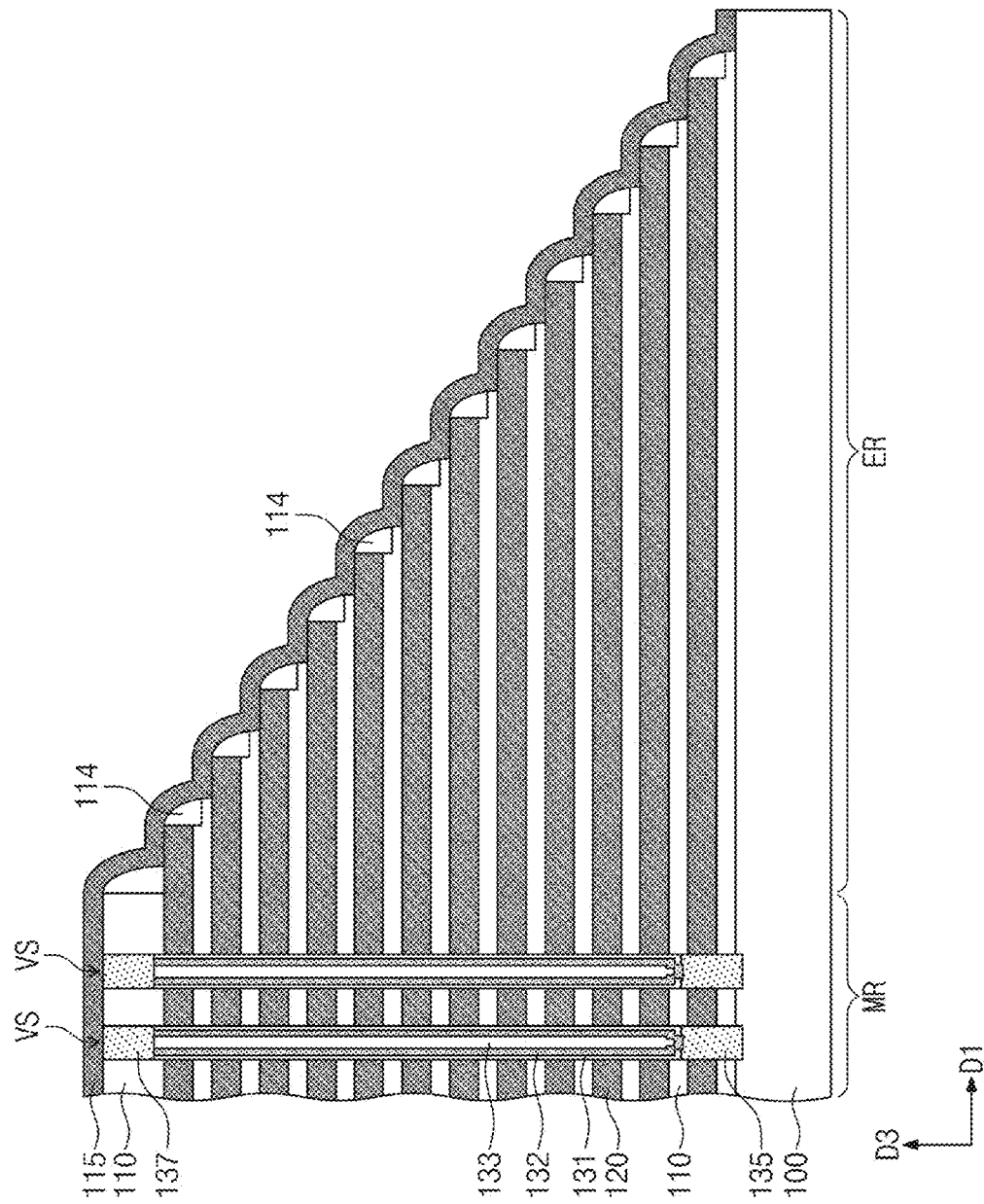
Figure 11:
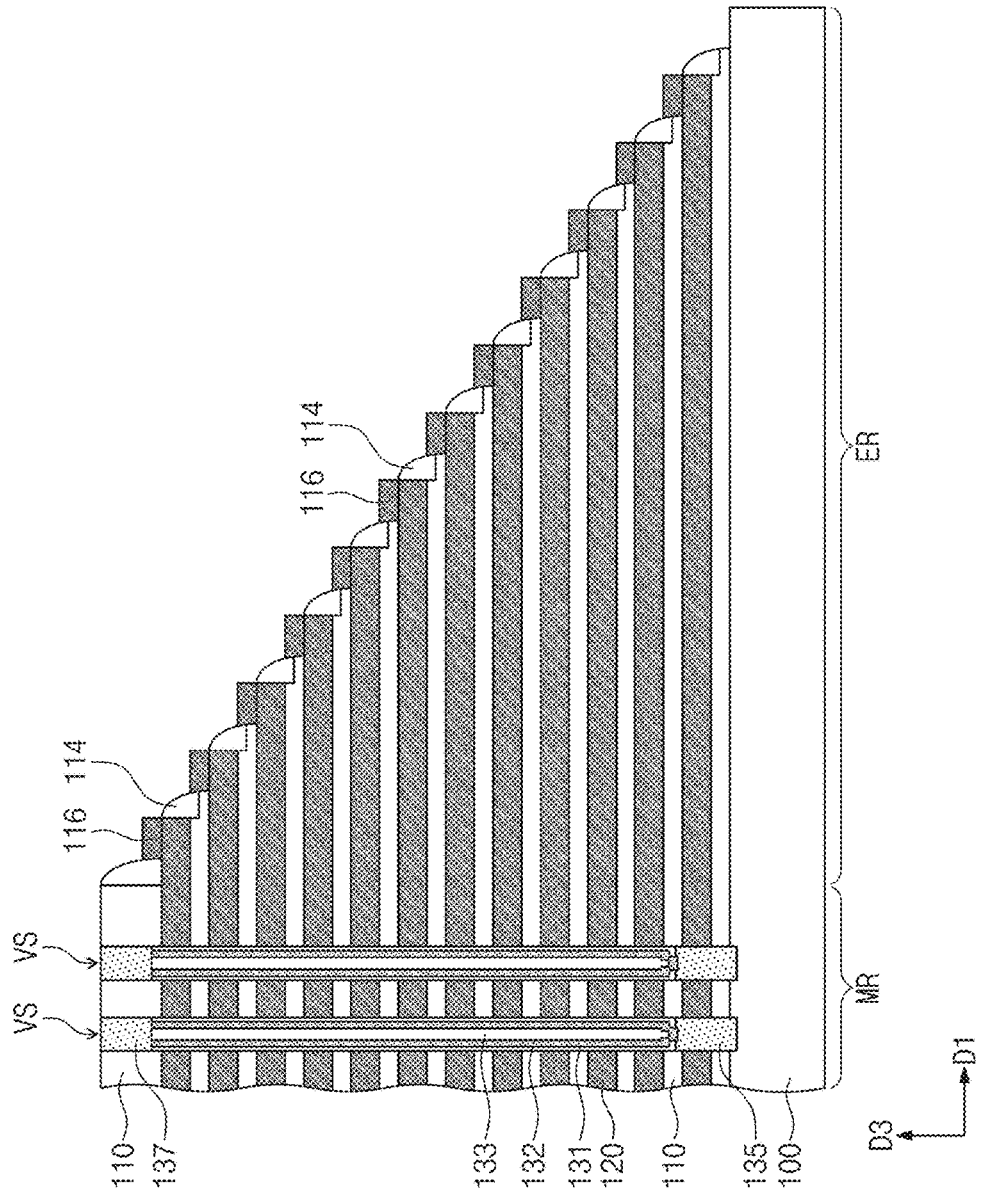

Referring to FIGS. 10 and 11, a second insulation layer 115 may be formed on a resultant structure where the spacers 114 are formed, and then an etch-back process may be performed to form sacrificial pads 116 on ends of the sacrificial patterns 120. For example, the second insulation layer 115 may be formed of a material having the same etching characteristics as the sacrificial patterns 120. For example, the second insulation layer 115 may be a silicon nitride layer.

A shape of contact regions CR as discussed with reference to FIGS. 5A to 5F may be determined based on a shape of the sacrificial pads 116. For example, a sidewall of each of the sacrificial pads 116 may be in contact with a sidewall of each of the spacers 114, and thus the sidewalls of the sacrificial pads 116 may be formed along a sidewall profile of the spacers 114. Subsequent processes may be performed to allow the contact regions CR to have an inclined sidewall as shown in FIG. 5C.

Figure 12:
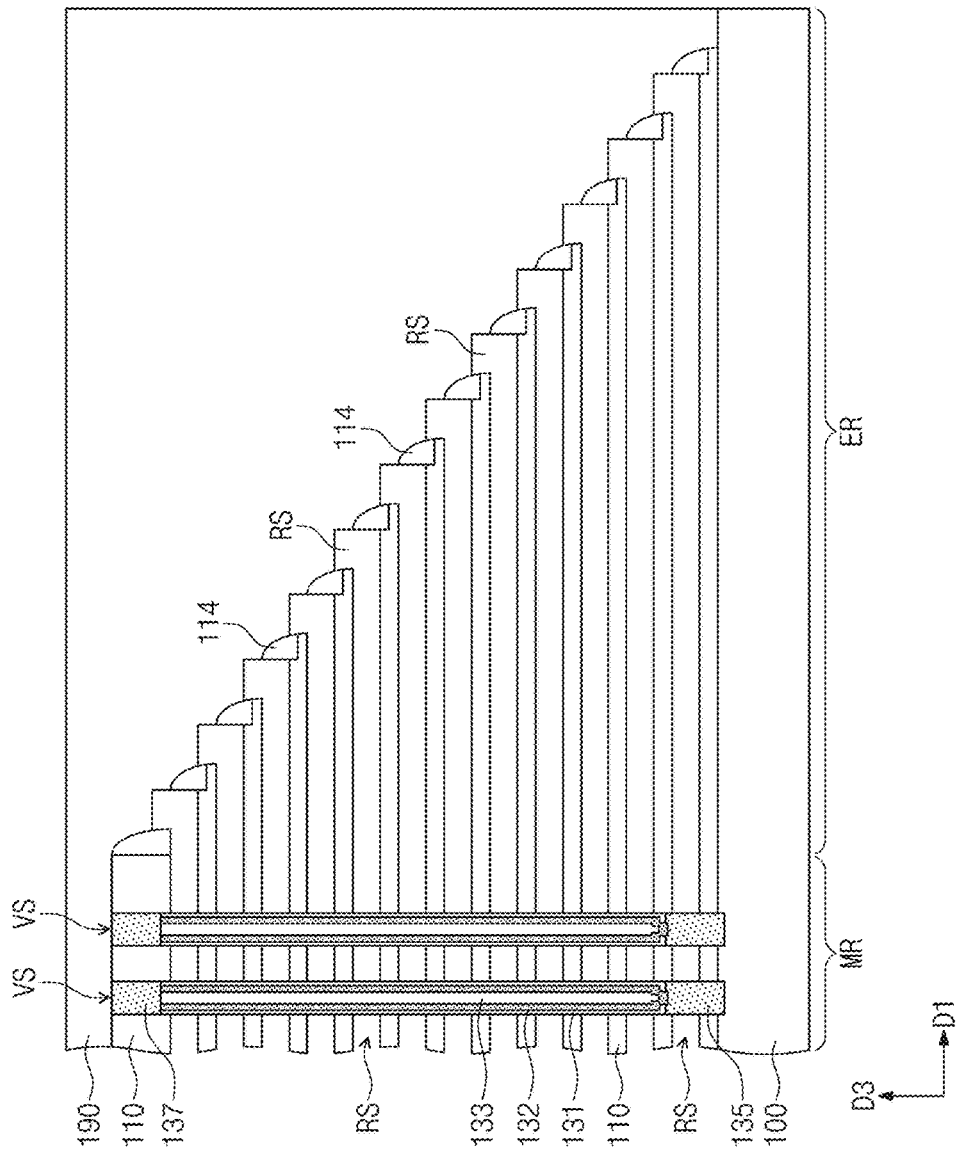

Referring to FIG. 12, an interlayer dielectric layer 190 may be formed to cover the stepwise structure, and then the sacrificial patterns 120 and the sacrificial pads 116 may be selectively removed to form gate regions RS. For example, the interlayer dielectric layer 190 may include a silicon oxide layer. For example, when both the sacrificial patterns 120 and the sacrificial pads 116 include a silicon nitride layer and both the insulation patterns 110 and the spacers 114 include a silicon oxide layer, the formation of the gate regions RS may be achieved using an etchant including phosphoric acid. The gate regions RS may reveal portions of sidewalls of the vertical channel structures VS. The etching process may be performed after a process step in which the sacrificial patterns 120 and the insulation patterns 110 are patterned to form an area corresponding to the spacing between the electrode structures ST discussed with reference to FIG. 4.

Referring back to FIG. 6, gate electrodes EP may be formed to fill the gate regions RS. For example, the gate electrodes EP may include doped silicon, metal (e.g., tungsten), metal nitride, metal silicide, or any combination thereof. The gate electrodes EP may have a shape corresponding to a shape of the gate regions RS, so that contact regions CR may be formed to fill regions from which the sacrificial pads 116 are removed. Thereafter, contacts (see FIGS. 5A to 5F) may be formed in contact with the contact regions CR and interconnect lines may be formed on the contacts.

In some example embodiments, the contact regions CR may be formed spaced apart from each other at a desired (and/or alternatively predetermined) distance. For example, the contact regions CR may be formed spaced apart from each other at a distance as much as a width of the spacer 114, and this spacing may contribute to reduce mutual connection of the contact regions CR when the gate electrodes EP are deposited.

Figure 13:
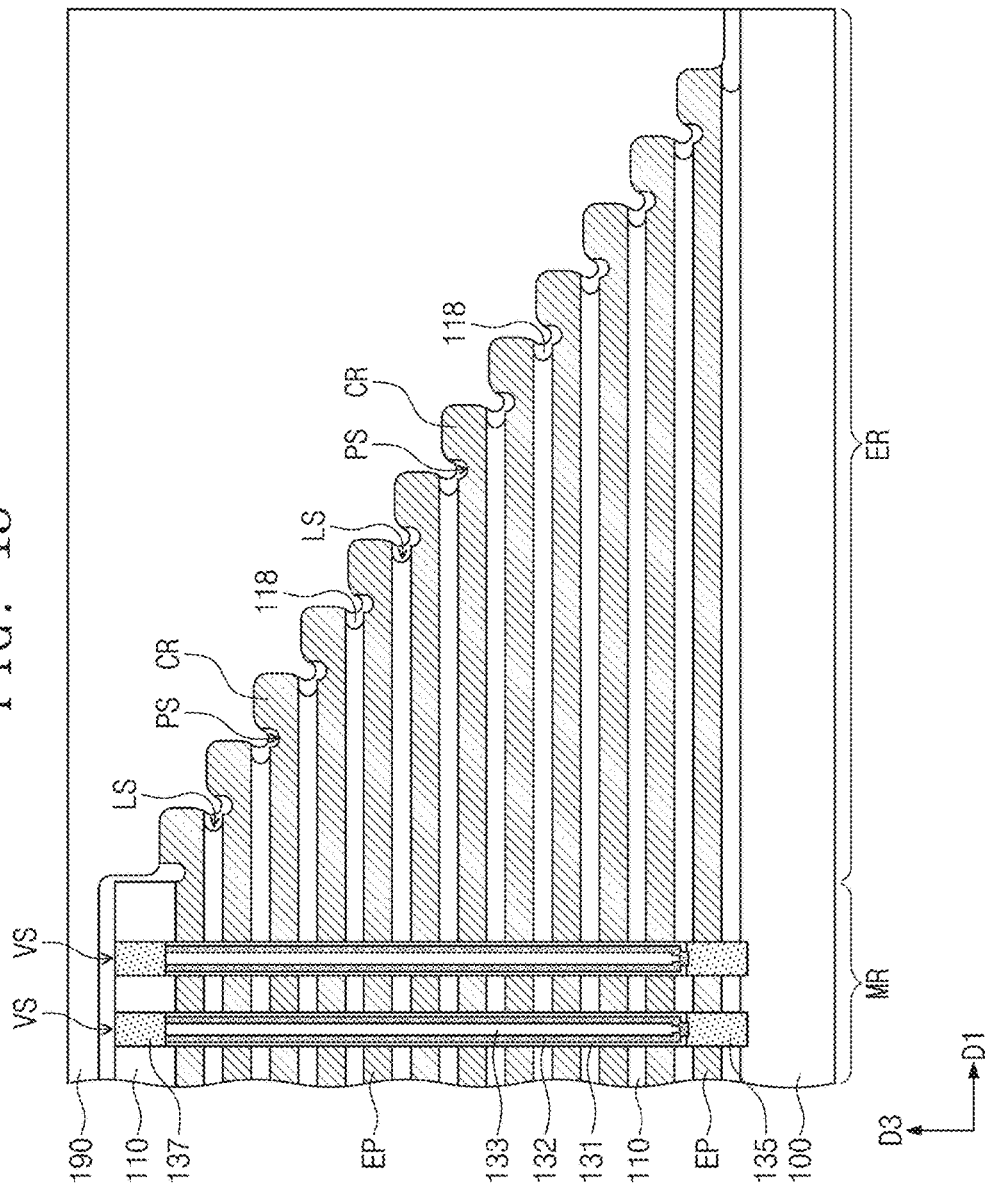
FIG. 13 is a cross-sectional view of a semiconductor device according to some example embodiments of inventive concepts.

FIG. 13 is a cross-sectional view of a semiconductor device according to some example embodiments of inventive concepts. For brevity of the description, a discussion of duplicate components will be omitted.

Referring to FIG. 13, similar to FIG. 5F, the gate electrodes EP of a semiconductor device according to some example embodiments may include first recessions PS, which are adjacent to the contact regions CR and whose top surfaces are recessed. The insulation patterns 110 may include second recessions LS on their recessed sidewalls adjacent to the contact regions CR. Gap-fill patterns 118 may be provided to fill the first and second recessions PS and LS. The gap-fill patterns 118 may include the same material as the insulation patterns 110. For example, the gap-fill patterns 118 may include silicon oxide.

FIGS. 14 to 18 are cross-sectional views for explaining a method of manufacturing a semiconductor device according to some example embodiments of inventive concepts.

Figure 14:
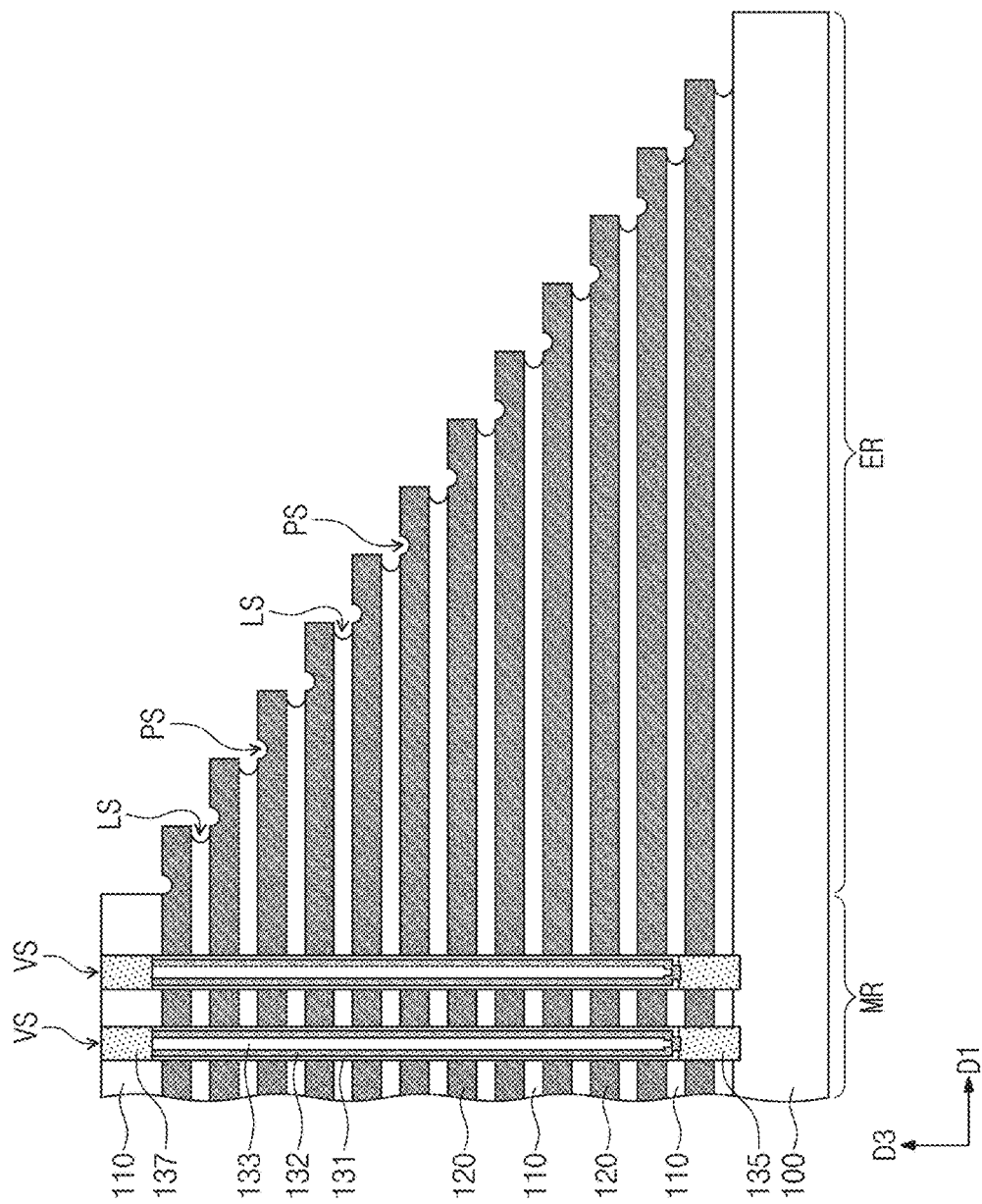
FIGS. 14 to 18 are cross-sectional views for explaining a method of manufacturing a semiconductor device according to some example embodiments of inventive concepts.

Referring to FIG. 14, an etching process may be performed on a resultant structure illustrated in FIG. 7 to form first recessions PS and second recessions LS. The etching process may employ a process that can selectively etch the insulation patterns 110 while reducing and/or minimizing etching of the sacrificial patterns 120. As a result, sidewalls of the insulation patterns 110 may be recessed to form the second recessions LS. The etching process may have a relatively low selectivity to corner parts, for example, portions adjacent to the sidewall of the sacrificial pattern 120, and therefore portions of top surfaces of the sacrificial patterns 120 may be simultaneously etched to form the first recessions PS.

Figure 15:
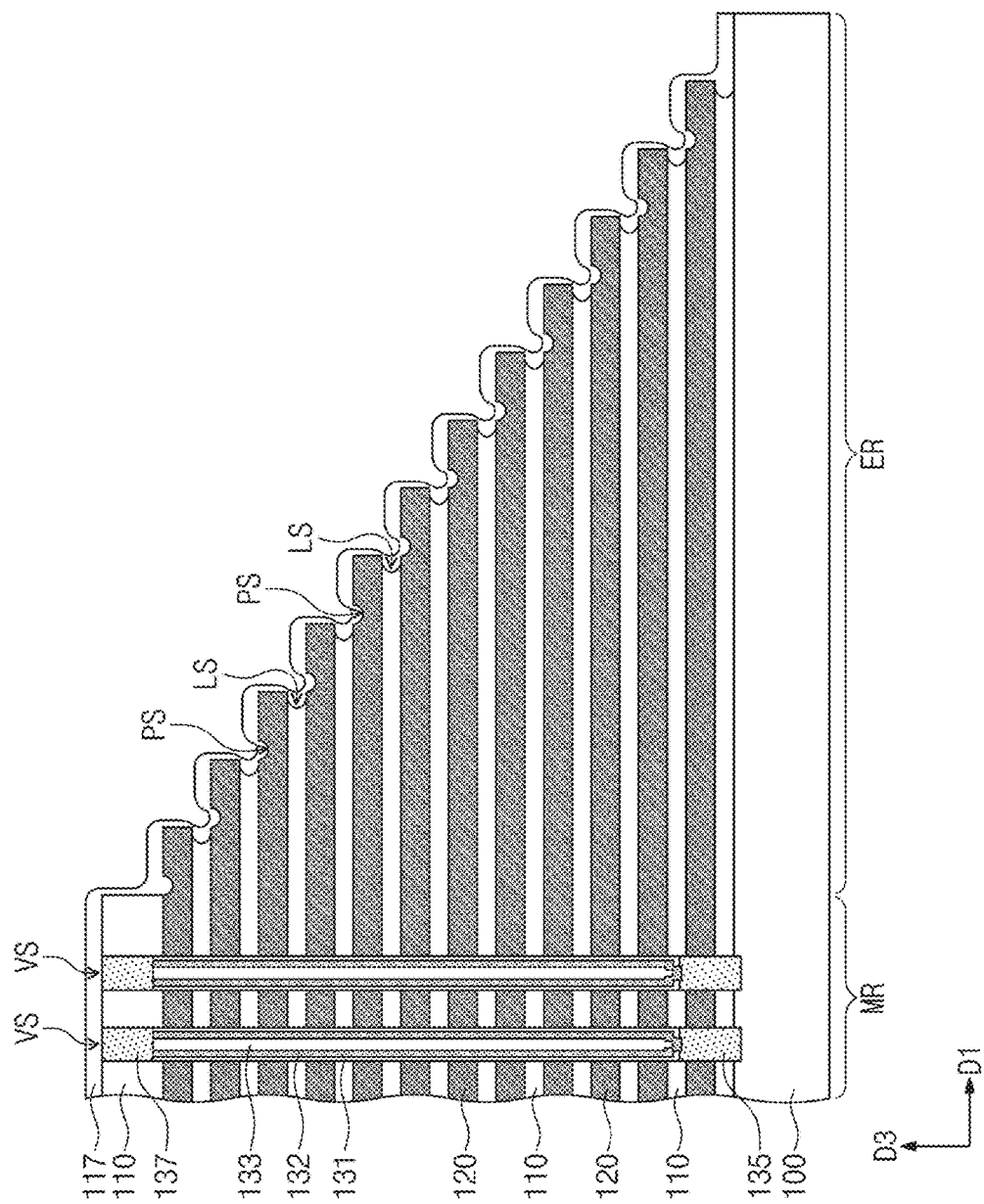

Referring to FIG. 15, a third insulation layer 117 may be formed on a resultant structure where the first and second recessions PS and LS are formed. The third insulation layer 117 may include the same material as the insulation patterns 110. For example, the third insulation layer 117 may include silicon oxide. The third insulation layer 117 may fill the first and second recessions PS and LS.

Figure 16:
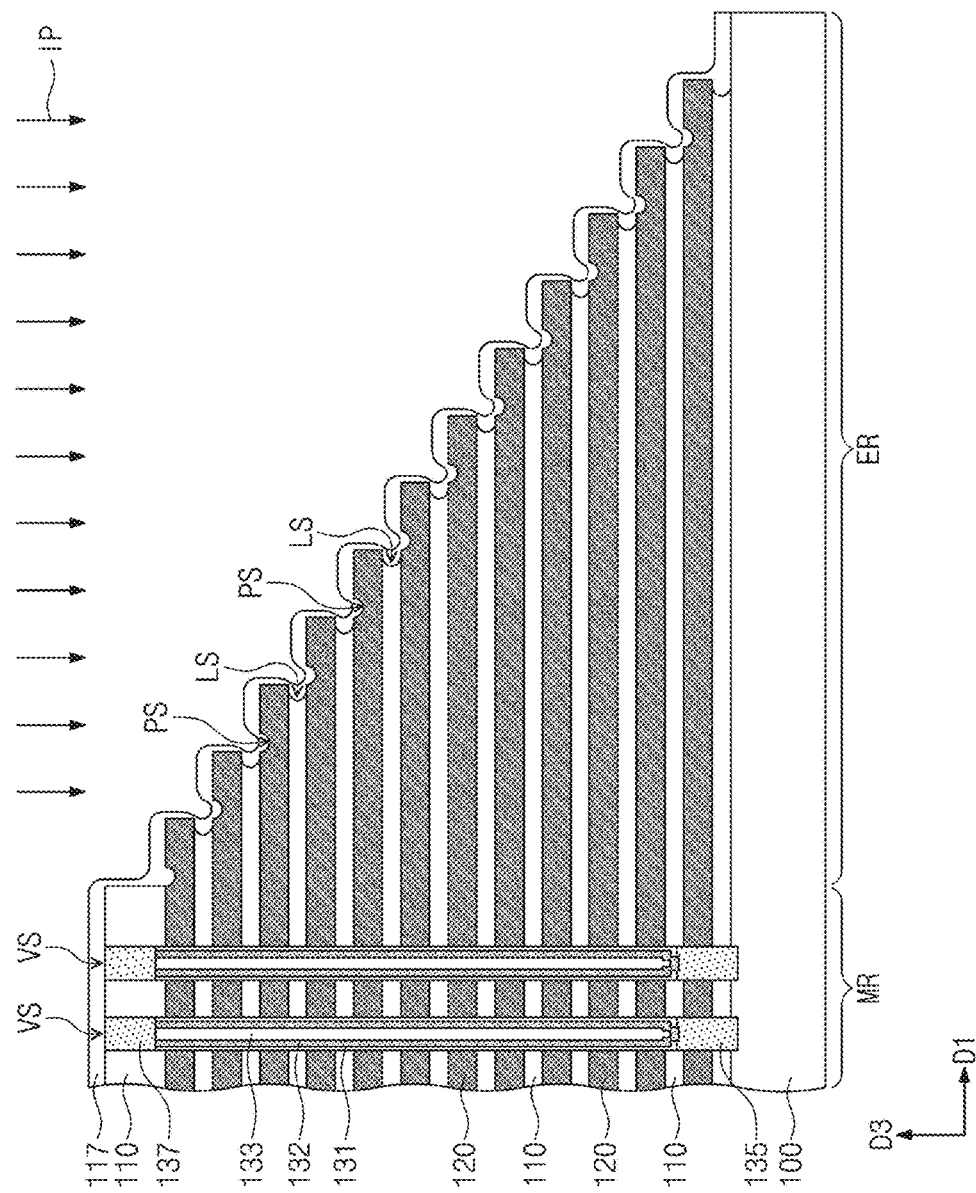
Figure 17:
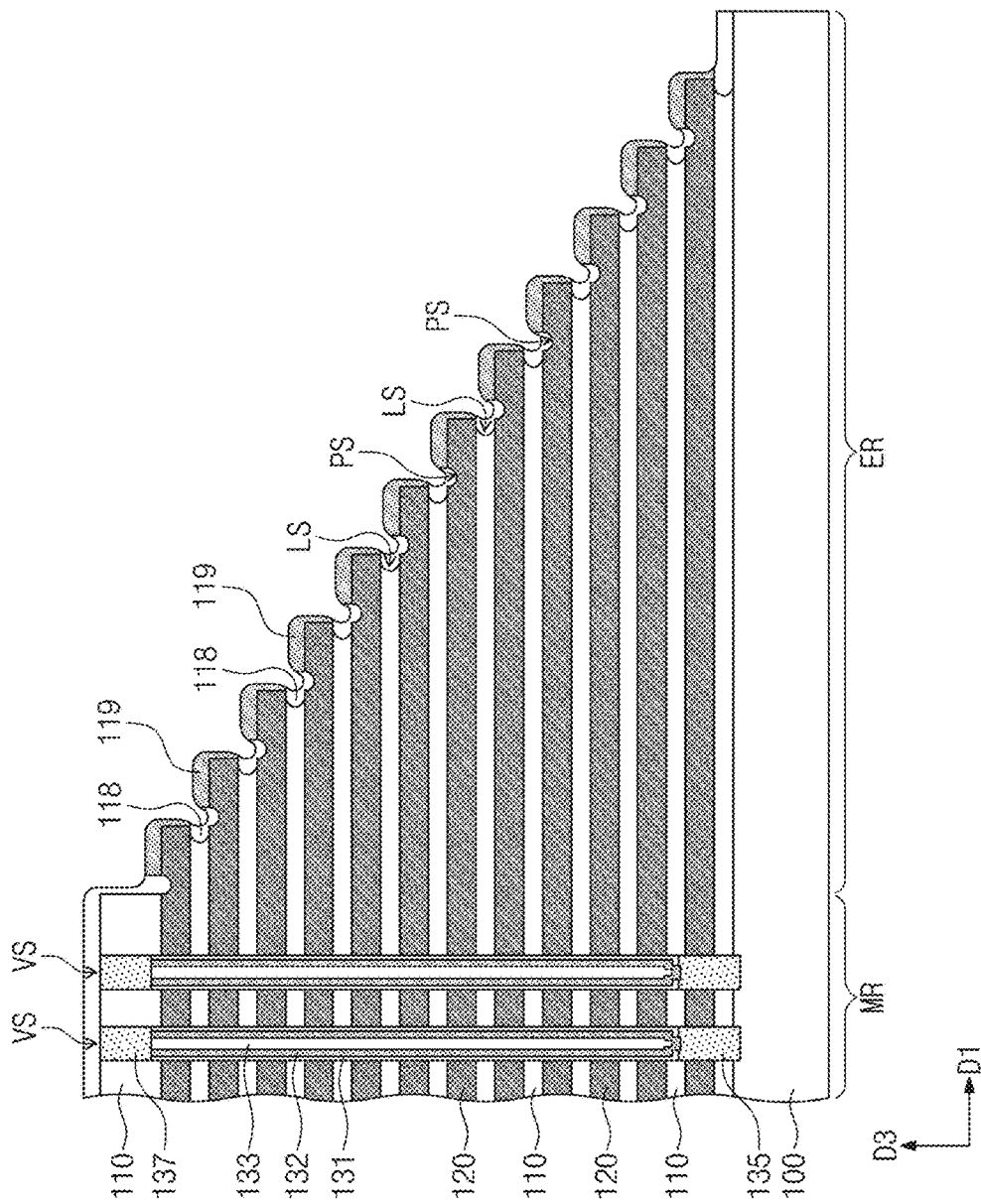

Referring to FIGS. 16 and 17, an ion implantation process IP may be performed on the third insulation layer 117. The ion implantation process may include an implantation process to inject a p-type impurity element. The ion implantation process IP may be performed limitedly on the extension zone ER or performed in a manner of a tilt angle ion implantation. Sacrificial pads 119 may be formed by injecting the p-type element into portions of the third insulation layer 117. Gap-fill patterns 118 may be defined by other portions of the third insulation layer 117 that are not changed into the sacrificial pads 119. The sacrificial pads 119 may have etching characteristics similar to the sacrificial patterns 120.

Figure 18:
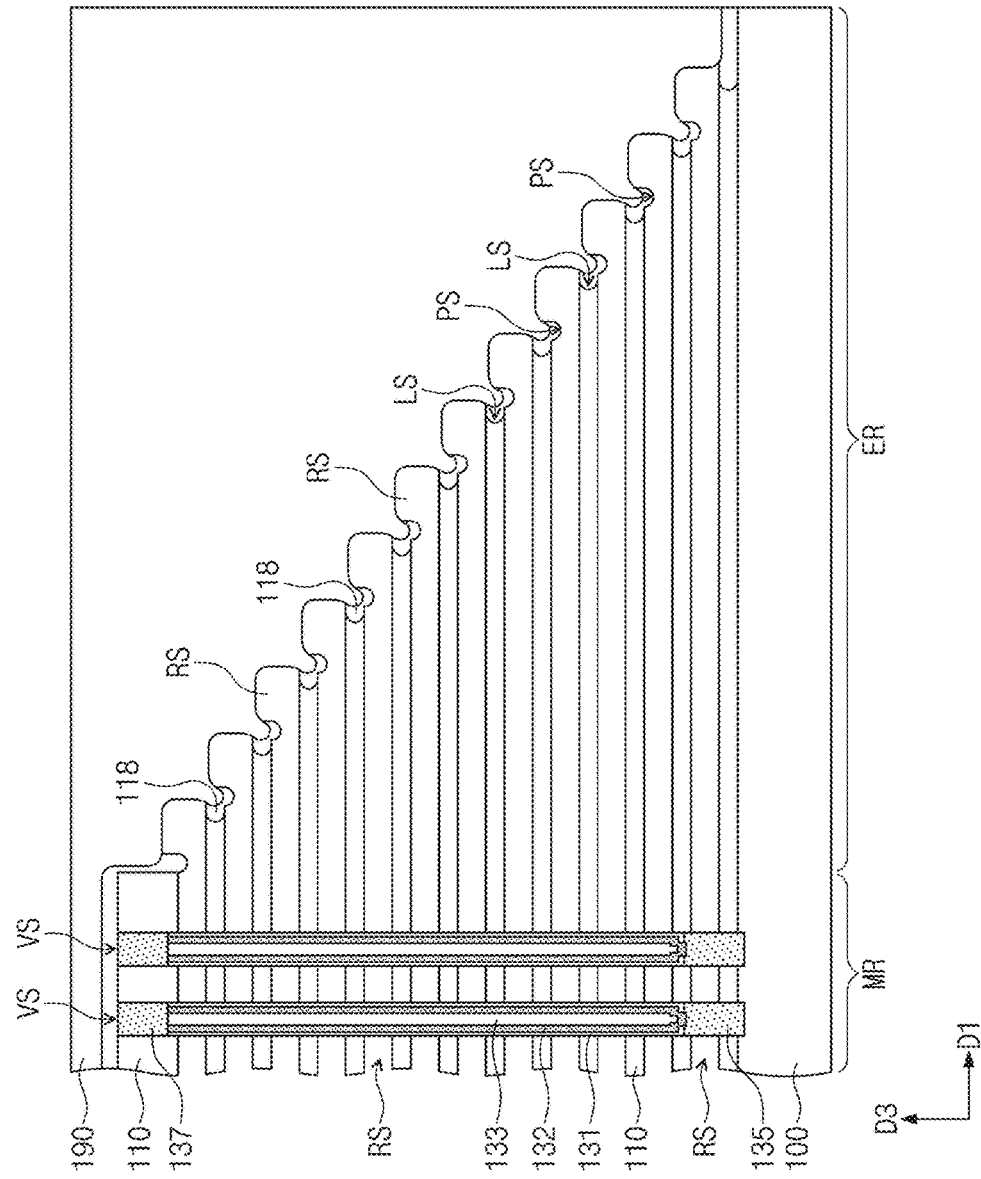

Referring to FIG. 18, an interlayer dielectric layer 190 may be formed to cover the stepwise structure, and then the sacrificial patterns 120 and the sacrificial pads 119 may be selectively removed to form gate regions RS. As the sacrificial pads 119 has etching characteristics similar to the sacrificial patterns as discussed above, the sacrificial pads 119 may be removed together with the sacrificial patterns 120. The gap-fill patterns 118 may remain without being removed together with the insulation patterns 110. Thereafter, as shown in FIG. 13, gate electrodes EP may be formed to fill the gate regions RS.

Figure 19:
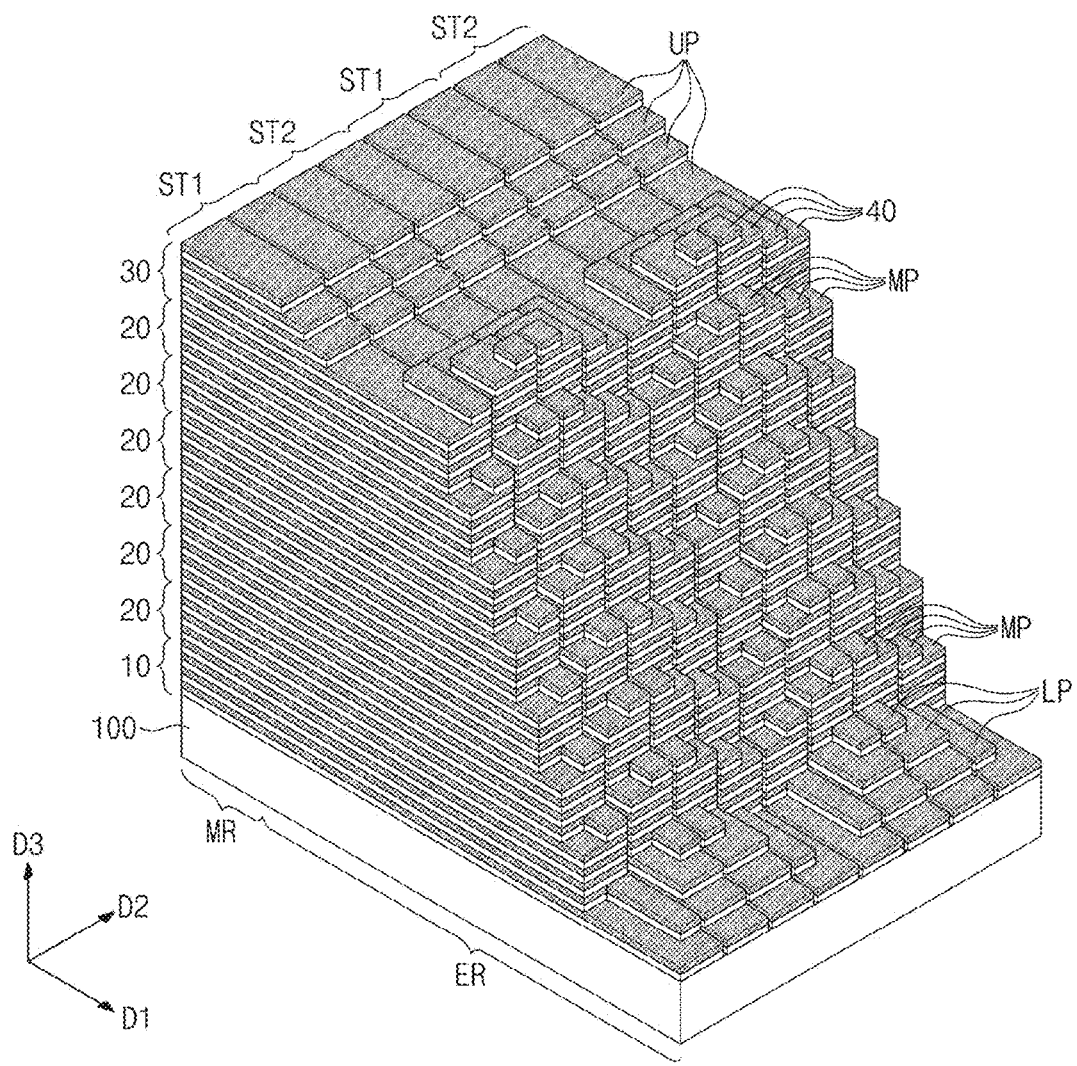
FIGS. 19 and 21 are perspective views for explaining a stepwise structure according to some example embodiments of inventive concepts.

The stepwise structure on the extension zone ER may be variously changed depending on a shape of mask pattern used for forming the stepwise structure. FIGS. 19 and 21 are perspective views for explaining a stepwise structure according to some example embodiments of inventive concepts. FIGS. 20A to 20E are plan views of gate electrodes. It will be hereinafter described about the extension zone ER according to some example embodiments of inventive concepts with reference to FIGS. 19, 20A to 20E, and 21.

Referring to FIGS. 19 and 21, a semiconductor device according to some example embodiments of inventive concepts may include a plurality of electrode structures ST1 and ST2 on the substrate 100. The first electrode structure ST1 and the second electrode structure ST2 may be disposed mirror-symmetrically about an imaginary line parallel to the first direction D1. Each of the first and second electrode structures ST1 and ST2 may include gate electrodes sequentially stacked on the substrate 100. The insulation patterns may be provided between the gate electrodes. The gate electrodes may include contact regions at their ends. Each of the first and second electrode structures ST1 and ST2 may include a first stepwise structure where the contact regions are arranged along the first direction D1 and a second stepwise structure where the contact regions are arranged along the second direction D2. In more detail, the contact regions may include a lower contact region LP, a middle contact region MP, and an upper contact region UP that have shapes different from each other in accordance with vertical positions of the gate electrodes.

For example, referring to FIG. 19, a lower stack 10 including lower electrodes having lower contact regions LP may have a stepwise structure along the first and second direction D1 and D2. A plurality of middle stacks 20, each of which includes middle electrodes having middle contact regions MP, may have a stepwise structure along the second direction D2, and the plurality of middle stacks 20 may have a stepwise structure along the first direction D1. An upper stack 30 including upper electrodes having upper contact regions UP may have a stepwise structure along the first direction D1. A dummy stack 40 may be disposed on an uppermost upper electrode of the upper stack 30.

Each of the gate electrodes may have the contract region whose shape is determined in accordance with a shape of its next-overlying gate electrode. The contact regions of the gate electrodes will be discussed below with reference to FIGS. 20A to 20E. Although FIGS. 20A to 20E as an example show some of the gate electrodes, it may be possible to analogize shapes of other gate electrodes and/or contact regions, which are currently omitted but shown in FIGS. 19 and 21, out of those shown in FIGS. 20A to 20E.

Figure 20A:
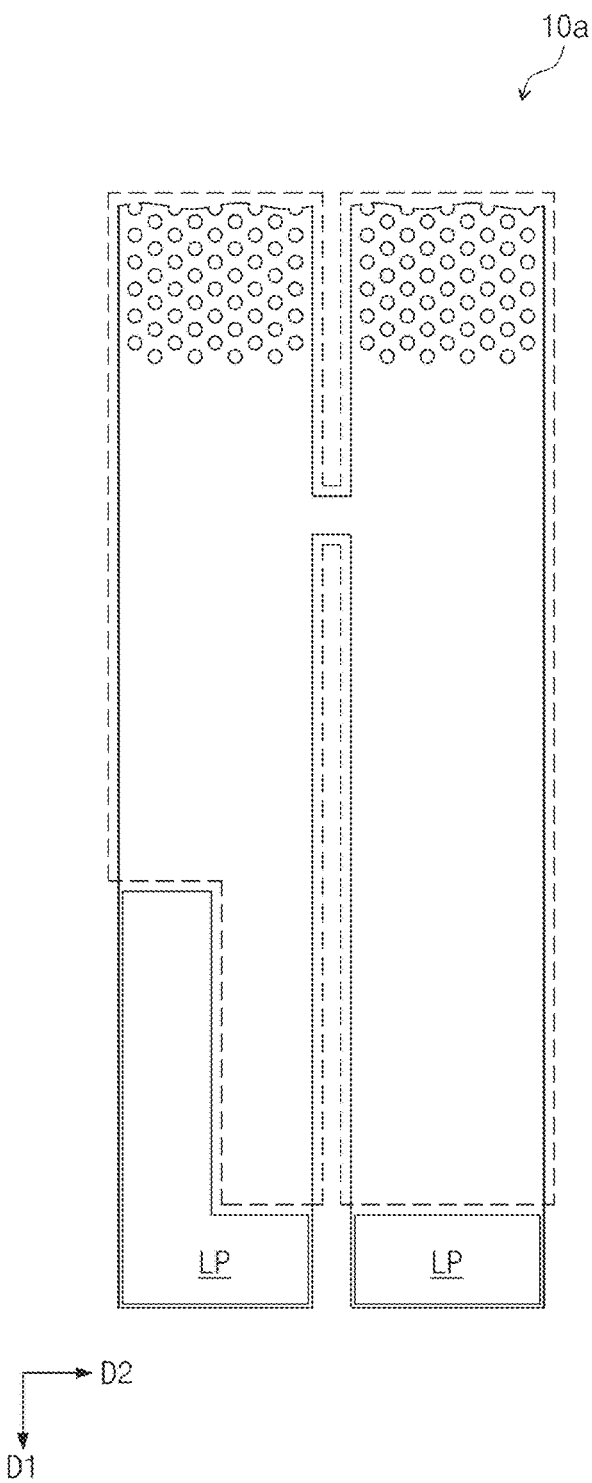
FIGS. 20A to 20E are plan views of gate electrodes.
Figure 20B:
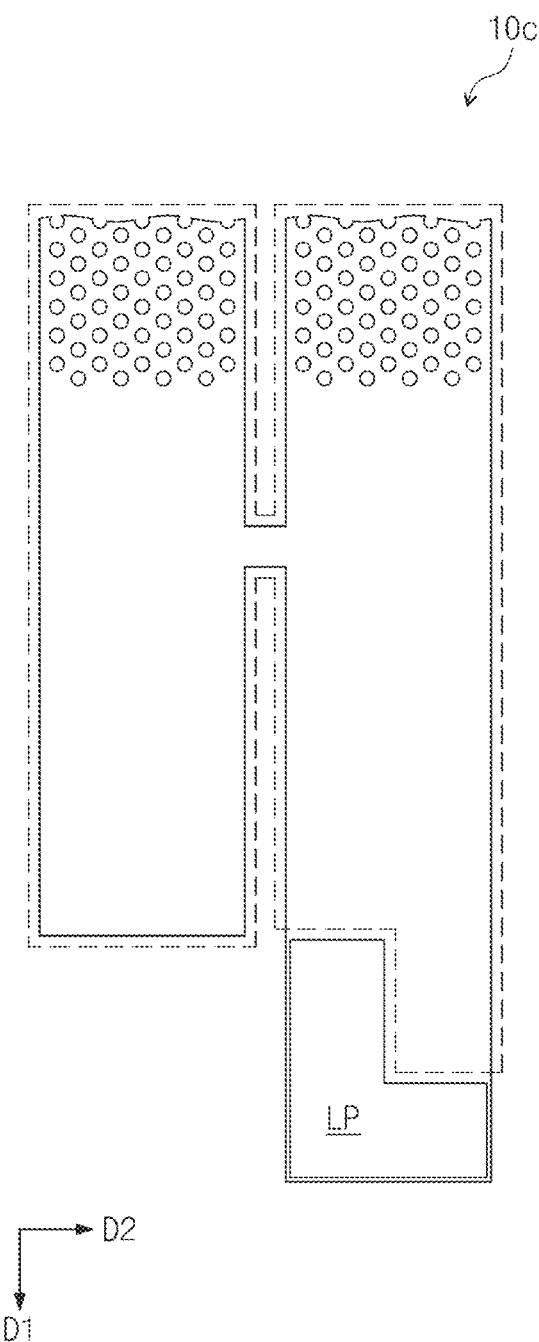
Figure 20C:
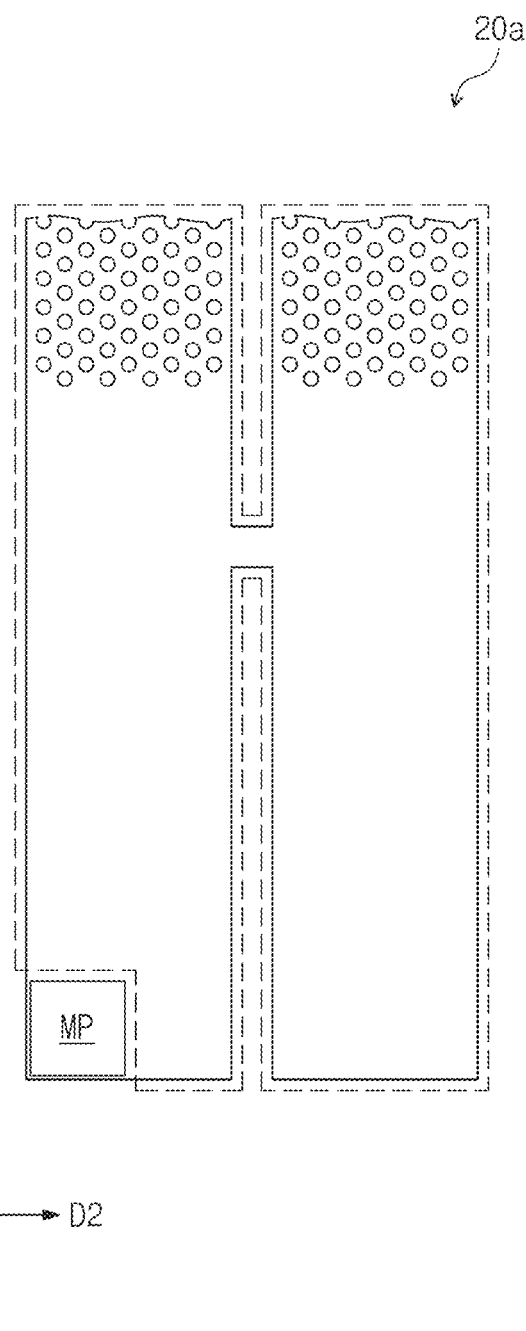
Figure 20D:
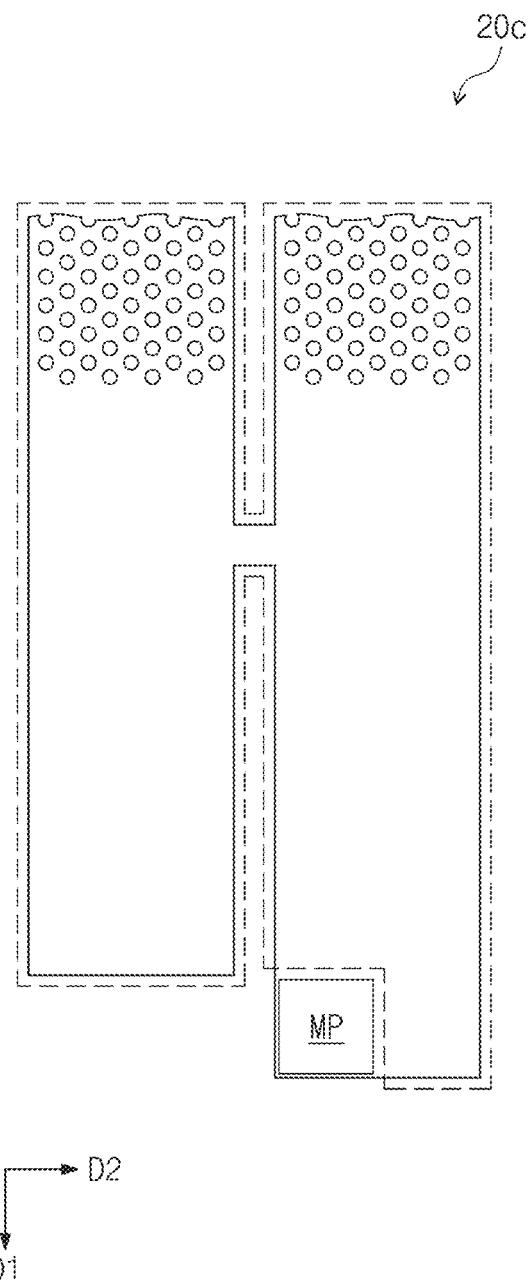
Figure 20E:
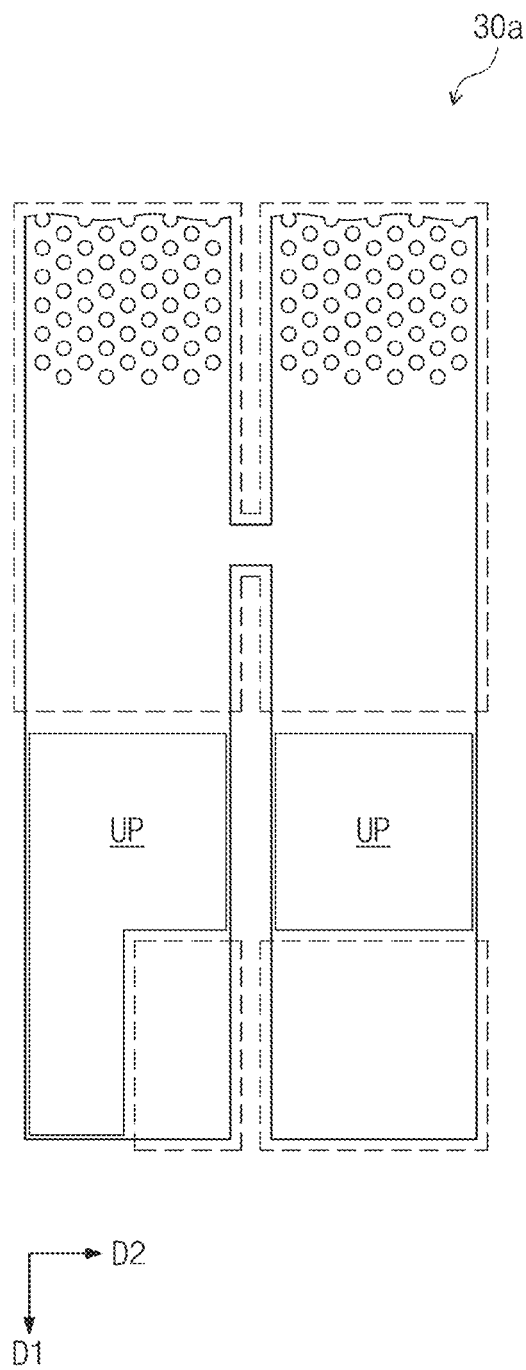
Figure 21:
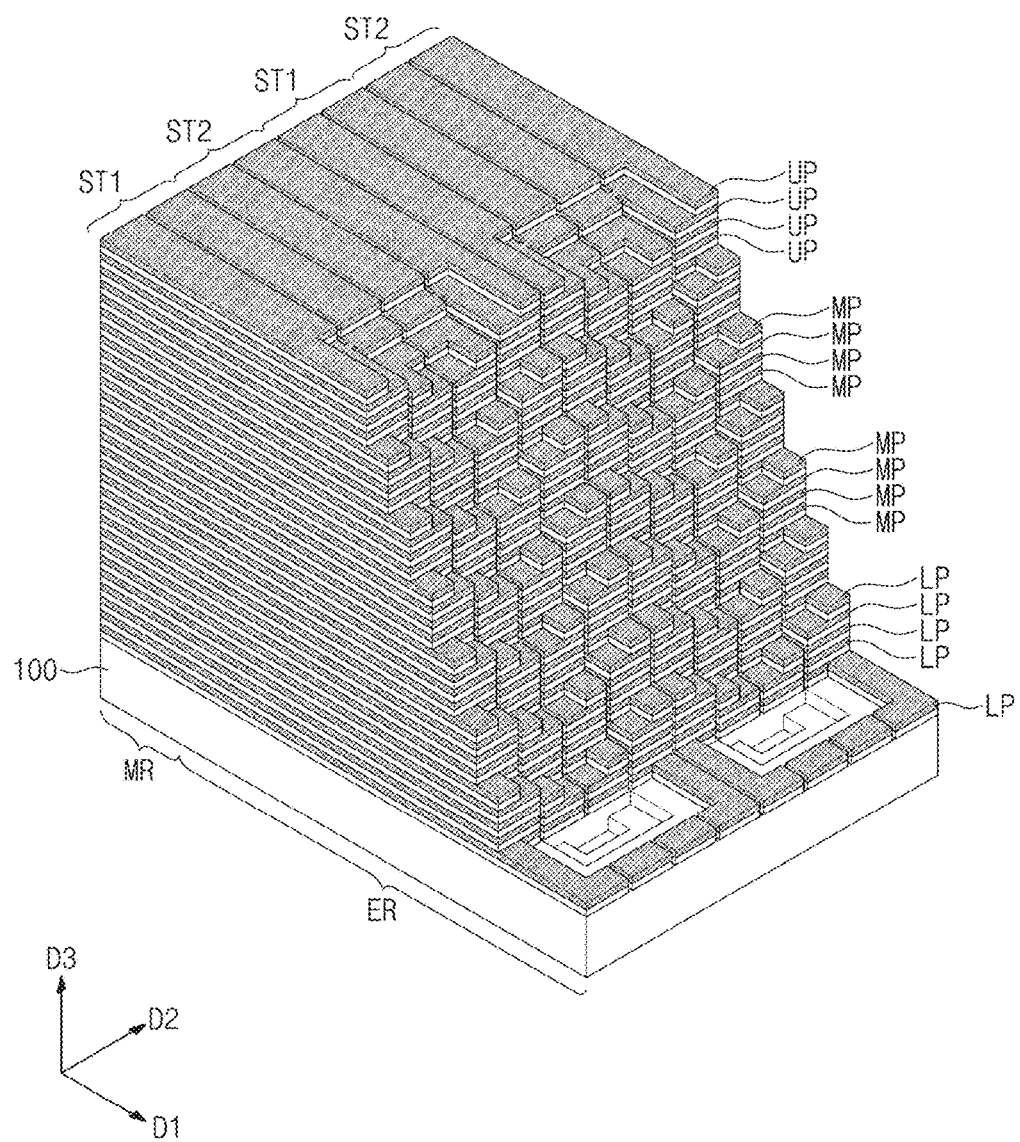

FIG. 20A is a plan view illustrating a lowermost story 10a of the lower stack 10 of FIG. 19, and FIG. 20B is a plan view illustrating a third story 10c of the lowermost story 10a of the lower stack 10 of FIG. 19. FIG. 20C is a plan view illustrating a lowermost story 20a of the middle stack 20 of FIG. 19, and FIG. 20D is a plan view illustrating a third story 20c to the lowermost story 20a of the middle stack 20 of FIG. 19. FIG. 20E is a plan view illustrating a lowermost story 30a of the upper stack 30 of FIG. 19. For each of the figures, a dotted line may indicate a shape of an overlying gate electrode. The contact regions LP, MP and CP may be relatively thick regions including the lower and upper portions P1 and P2 shown in FIGS. 5A to 5F. As shown in figures, some of the contact regions may have a rectangular planar shape, but are not limited thereto. For example, for a pair of gate electrodes, when an overlying gate electrode has a first sidewall and a second sidewall connected to the first sidewall and also the first and second sidewalls are disposed on an underlying gate electrode, the contact region of the underlying gate electrode may have a portion extending along the first sidewall and other portion extending along the second sidewall. For example, as shown in FIGS. 20A, 20B and 20E, one or more of the contact regions may have all of the portions extending along the first and second direction D1 and D2.

According to some example embodiments of inventive concepts, it may be possible to limit and/or prevent bridge caused by connection of adjacent contact regions. Moreover, the contact regions may have an increased thickness such that the contacts may be stably formed connected to the contact regions.

Although some example embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:
1. A semiconductor device, comprising:
   a substrate including a main zone and an extension zone;
   vertical channel structures on the main zone, the vertical channel structures extending in a first direction perpendicular to a top surface of the substrate; and
   an electrode structure including gate electrodes stacked on the substrate,
      the gate electrodes including line regions and contact regions,
      the line regions extending from the main zone toward the extension zone along a second direction that is perpendicular to the first direction,
      the contact regions being on ends of the line regions,
      the contact regions being thicker than the line regions,
      an interface between the line regions and the contact regions being defined by a thickness transition, from a first thickness to a second thickness at terminal regions of the gate electrodes, measured from a lower surface of the gate electrodes to an upper surface of the gate electrodes,
   the second thickness being greater than the first thickness,
      the contact regions having the second thickness, and a spacing distance in the second direction between the contact regions is greater than a spacing distance in the first direction between the line regions, wherein each of the contact regions includes a top surface and a bottom surface, a first width of the top surface is greater than a second width of the bottom surface, wherein each of the contact regions comprises a lower portion connected to a corresponding one of the line regions and an upper portion protruding from a top surface of the corresponding one of the line regions such that the upper portion laterally protrudes over the corresponding one of the line regions.

2. The semiconductor device of claim 1, wherein
the gate electrodes include a first gate electrode and a second gate electrode that are adjacent to each other in the first direction,
the second gate electrode is below the first gate electrode,
the first gate electrode includes a first line region and a first contact region, and
the second gate electrode includes a second line region and a second contact region.

3. The semiconductor device of claim 2, wherein a distance between the first contact region and the second contact region is greater than a distance between a bottom surface of the first line region and a top surface of the second line region.

4. The semiconductor device of claim 2, wherein a top surface of the second contact region is higher than a bottom surface of the first contact region.

5. The semiconductor device of claim 2, wherein
the first contact region includes a first sidewall connected to a second sidewall, and
the first contact region includes a first portion extending along the first sidewall and a second portion extending along the second sidewall.

6. The semiconductor device of claim 1, wherein
the contact regions include sidewalls,
the line regions include top surfaces, and
the sidewalls of the contact regions in direct contact with the top surfaces of the line regions make an acute angle with the top surfaces of the line regions.

7. The semiconductor device of claim 1, wherein a thickness of the contact regions decreases with as a distance from the line regions increases.

8. The semiconductor device of claim 1, wherein
a width of a top surface of the upper portion is greater than a width of a bottom surface of the upper portion, and
an entirety of the upper portion of the contact region is at a height above the lower portion of the contact region and the top surface of the corresponding one of the line regions.

9. The semiconductor device of claim 1, wherein
the line regions include a recession on portions thereof adjacent to the contact regions, and
the recession has a recessed top surface.

10. The semiconductor device of claim 1, wherein the electrode structure includes:
a first stepwise structure where the contact regions are arranged along the second direction; and
a second stepwise structure where the contact regions are arranged along a third direction perpendicular to the first direction and the second direction.

11. The semiconductor device of claim 1, further comprising;
insulation patterns between the gate electrodes; and
spacers on sidewalls of the contact regions, wherein
a material of the spacers is the same as a material of the insulation patterns.

12. The semiconductor device of claim 1, wherein
the upper portion overlaps the corresponding one of the line regions, and
an entirety of the of the upper portion of the contact region is at a height above the lower portion of the contact region and the top surface of the corresponding one of the line regions.

13. A semiconductor device, comprising:
a substrate including a main zone and an extension zone;
an electrode structure including gate electrodes stacked on the substrate,
each of the gate electrodes including a line region and a contact region,
the line region extending from the main zone toward the extension zone,
the contact region on an end of the line region and thicker than the line region,
a top surface of the contact region being higher than a bottom surface of the line region of the gate electrode directly above the contact region,
an interface between the line region and the contact region in a corresponding gate electrode among the gate electrodes being defined by a thickness transition, from a first thickness to a second thickness at a terminal region of the corresponding gate electrode, measured from a lower surface of the corresponding gate electrode to an upper surface of the corresponding gate electrode,
the second thickness being greater than the first thickness,
the contact region having the second thickness; and
vertical channel structures on the main zone, the vertical channel structures penetrating the electrode structure,
wherein each of the contact regions includes a lower portion connected to a corresponding one of the line regions and an upper portion protruding from a top surface of the corresponding one of the line regions such that the upper portion laterally protrudes over the corresponding one of the line regions, and
a width of a top surface of the upper portion is greater than a width of a bottom surface of the upper portion.

14. The semiconductor device of claim 13, wherein
the upper portion of the gate electrodes has a sidewall protruding from a sidewall of the portion of the gate electrodes.

15. A semiconductor device, comprising:
a substrate; and
a memory cell array on the substrate,
the memory cell array including gate electrodes stacked on top of each other,
each of gate electrodes including a line region and a contact region connected to an end of the line region,
an interface between the line regions and the contact regions being defined by a thickness transition, from a first thickness to a second thickness at terminal regions of the gate electrodes, measured from a lower surface of the gate electrodes to an upper surface of the gate electrodes,
the second thickness being greater than the first thickness,
the contact regions having the second thickness,
the gate electrodes including a first gate electrode over a second gate electrode,
the line regions of the first and second gate electrodes being separated from each other by a first distance in a first direction vertical to a top surface of the substrate, the contact regions of the first and second gate electrodes being separated from each other by a second distance in a second direction that is parallel to the top surface of the substrate and less than the first distance,
a top surface of the contact region of the first gate electrode being above a top surface of the line region of the first gate electrode, and
a top surface of the contact region of the second gate electrode being above a top surface of the line region of the second gate electrode, wherein
the contact regions each include a lower portion connected to a corresponding one of the line regions and an upper portion protruding from a top surface of the corresponding one of the line regions,
a width of a top surface of the upper portion is greater than a width of a bottom surface of the upper portion, and
the upper portion of the contact regions laterally protrudes over the line region.

16. The semiconductor device of claim 15, wherein the contact regions of the gate electrodes are thicker than the line regions of the gate electrodes, and
the memory cell array includes vertical channel structures.

17. The semiconductor device of claim 15, wherein the top surface of the contact region of the second gate electrode is higher than a bottom surface of the contact region of the first gate electrode.

18. The semiconductor device of claim 15, wherein the gate electrodes extend further in the second direction as the gate electrodes are closer to the substrate such that the contact regions of the gate electrodes form a stepwise structure.

19. The semiconductor device of claim 15, wherein the line region of at least one of the gate electrodes includes a recession that includes a recessed top surface adjacent to the contact region of the at least one of the gate electrode.

* * * * *